(12) United States Patent
Katti

(10) Patent No.: US 8,427,197 B2
(45) Date of Patent: Apr. 23, 2013

(54) CONFIGURABLE REFERENCE CIRCUIT FOR LOGIC GATES

(75) Inventor: Romney R. Katti, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/161,070

(22) Filed: Jun. 15, 2011

(65) Prior Publication Data

US 2012/0319727 A1 Dec. 20, 2012

(51) Int. Cl.
*H03K 17/16* (2006.01)
*H03K 19/003* (2006.01)

(52) U.S. Cl.
USPC .............................................. 326/30; 326/38

(58) Field of Classification Search .......................... None
See application file for complete search history.

(56) References Cited

U.S. PATENT DOCUMENTS

| | | | |
|---|---|---|---|
| 5,739,704 A | 4/1998 | Clark | |
| 6,034,887 A | 3/2000 | Gupta et al. | |
| 6,050,335 A | 4/2000 | Parsons | |
| 6,343,032 B1 | 1/2002 | Black et al. | |
| 6,351,409 B1 | 2/2002 | Rizzo et al. | |
| 6,526,559 B2 | 2/2003 | Schiefele et al. | |
| 6,657,888 B1 | 12/2003 | Doudin et al. | |
| 6,809,900 B2 | 10/2004 | Covington | |
| 6,950,335 B2 | 9/2005 | Dieny et al. | |
| 6,985,318 B2 | 1/2006 | Clinton et al. | |
| 6,985,930 B2 | 1/2006 | Oikawa | |
| 6,992,501 B2 * | 1/2006 | Rapport | 326/30 |
| 7,075,807 B2 | 7/2006 | Leuschner et al. | |
| 7,096,437 B2 | 8/2006 | Ditto et al. | |
| 7,218,139 B1 | 5/2007 | Young et al. | |
| 7,241,631 B2 | 7/2007 | Huai et al. | |
| 7,267,999 B2 | 9/2007 | Drewes | |
| 7,332,781 B2 | 2/2008 | Nozieres et al. | |
| 7,379,321 B2 | 5/2008 | Ravelosona et al. | |
| 7,394,684 B2 | 7/2008 | Inokuchi et al. | |
| 7,397,285 B2 | 7/2008 | Agan et al. | |
| 7,400,166 B2 | 7/2008 | Bangert | |

(Continued)

FOREIGN PATENT DOCUMENTS

| | | |
|---|---|---|
| EP | 0575738 A2 | 12/1993 |
| EP | 2172969 A1 | 4/2010 |
| WO | 2010024126 A1 | 3/2010 |
| WO | 2010029326 A1 | 3/2010 |

OTHER PUBLICATIONS

Li et al., "Ultrahigh-Speed Reconfigurable Logic Gates Based on Four-Wave Mixing in a Semiconductor Optical Amplifier," IEEE Photonics Technology Letters, vol. 18, No. 12, Jun. 15, 2006, 3 pages.

(Continued)

*Primary Examiner* — Crystal L Hammond

(74) *Attorney, Agent, or Firm* — Shumaker & Sieffert, P.A.

(57) ABSTRACT

This disclosure is directed to techniques for generating a reference current based on a combinational logic function that is to be performed by a magnetic logic device. A comparator circuit may compare an amplitude of a read current that flows through the magnetic logic device and the reference current to generate a logic output value that corresponds to the logic output value when combinational logic function is applied to the input values. By selecting appropriate amplitudes for the reference current the magnetic logic device may be caused to implement different combinational logic functions.

20 Claims, 15 Drawing Sheets

U.S. PATENT DOCUMENTS

| | | | |
|---|---|---|---|
| 7,425,377 | B2 | 9/2008 | Fullerton et al. |
| 7,465,502 | B2 | 12/2008 | Gusliyenko |
| 7,596,018 | B2 | 9/2009 | Johnson |
| 7,630,231 | B2 | 12/2009 | Miltat et al. |
| 7,684,233 | B2 | 3/2010 | Lim et al. |
| 7,710,766 | B2 | 5/2010 | Mullner et al. |
| 7,719,881 | B2 | 5/2010 | Bangert |
| 7,825,686 | B2 | 11/2010 | Hoeink et al. |
| 7,852,665 | B2 | 12/2010 | Chen et al. |
| 7,870,472 | B2 | 1/2011 | Thorp et al. |
| 7,940,592 | B2 | 5/2011 | Reed et al. |
| 8,027,206 | B2 | 9/2011 | Yoon et al. |
| 2003/0227907 | A1 | 12/2003 | Choi et al. |
| 2004/0108561 | A1 | 6/2004 | Jeong |
| 2006/0125034 | A1 | 6/2006 | Ohba et al. |
| 2006/0145806 | A1 | 7/2006 | Kim et al. |
| 2006/0176620 | A1 | 8/2006 | Ravelosona et al. |
| 2007/0063237 | A1 | 3/2007 | Huai et al. |
| 2007/0224454 | A1 | 9/2007 | Ingvarsson et al. |
| 2008/0100345 | A1 | 5/2008 | Bratkovski et al. |
| 2008/0150578 | A1 | 6/2008 | Kiel et al. |
| 2008/0238475 | A1 | 10/2008 | Chua-Eoan |
| 2008/0278196 | A1 | 11/2008 | Ditto et al. |
| 2009/0027949 | A1 | 1/2009 | Koga et al. |
| 2009/0046501 | A1 | 2/2009 | Ranjan et al. |
| 2009/0296462 | A1 | 12/2009 | Kent et al. |
| 2009/0317923 | A1 | 12/2009 | Sun et al. |
| 2009/0323402 | A1 | 12/2009 | Li et al. |
| 2010/0039136 | A1* | 2/2010 | Chua-Eoan et al. ............ 326/38 |
| 2010/0078723 | A1 | 4/2010 | Bertin et al. |
| 2010/0080048 | A1 | 4/2010 | Liu et al. |
| 2010/0090262 | A1 | 4/2010 | Saito et al. |
| 2010/0148288 | A1 | 6/2010 | Johnson |
| 2010/0194431 | A1 | 8/2010 | Chua-Eoan et al. |
| 2010/0219858 | A1 | 9/2010 | Ditto et al. |
| 2010/0315123 | A1 | 12/2010 | Niemier et al. |
| 2011/0006807 | A1 | 1/2011 | Schneiderwind |
| 2011/0026336 | A1 | 2/2011 | Huang et al. |
| 2012/0105101 | A1 | 5/2012 | Katti |
| 2012/0105102 | A1 | 5/2012 | Katti |
| 2012/0105103 | A1 | 5/2012 | Katti |
| 2012/0106233 | A1 | 5/2012 | Katti |

OTHER PUBLICATIONS

Office Action from U.S. Appl. No. 12/916,174, dated Nov. 10, 2011, 14 pp.

Response to Office Action dated Nov. 10, 2011, from U.S. Appl. No. 12/916,174, filed Jan. 10, 2012, 12 pp.

Office Action dated Jun. 23, 2011, for U.S. Appl. No. 12/916,174, 10 pages.

Responsive Amendment dated Sep. 23, 2011 for U.S. Appl. No. 12/916,174, 12 pages.

Mukherjee et al., "Switching of Composite Media by Wall Propagation," Published in Journal of Applied Physics, vol. 99, No. 8, Apr. 15, 2006. Citation retrieved from DailogWeb. Abstract retrieved from the Internet at http://jap.aip.org/japiau/v99/i8/p08q909_s1?isAuthorized=no.

Lyberatos et al., "Thermal Effects in the High-Speed Switching of the Magnetization of Fine Grains," Published in Intermag Europe 2002 Diget of Technical Papers, 2002 IEEE International Magnetics Conference, Apr. 28-May 2, 2002, 1 page.

Matsunaga et al., "MTJ-Based Nonvolatile Logic-In-Memory Circuit, Future Prospects and Issues," Apr. 20-24, 2009, 3 pages, retrieved from http://www.date-conference.com/proceedings/PAPERS/2009/DATE09/PDFFILES/05.2_1.PDF.

Nozaki et al., "Size Dependence of Switching Current and Energy Barrier in the Magnetization Reversal of Rectangular Magnetic Random Access Memory Cell," Journal of Applied Physics, vol. 93, No. 10, 3 pages, May 15, 2003.

Caruso et al., "A New Prospective on Magnetic Field Sensing," 19 pgs., May 1998 downloaded from http://www.ssec.honeywell.com/magnetic/datasheets/new_pers.pdf.

Prinz, "Magnetoelectronics Applications," Journal of Magnetism and Magnetic Materials 200, pp. 57-68, 1999.

Office Action dated Jun. 23, 2011, for U.S. Appl. No. 12/916,174, 11 pages.

Response dated Sep. 23, 2011, for U.S. Appl. No. 12/916,174, 12 pages.

Office Action dated Oct. 11, 2011, for U.S. Appl. No. 12/916,046, 12 pages.

Office Action dated Nov. 10, 2011, for U.S. Appl. No. 12/916,174, 13 pages.

Response dated Jan. 10, 2012, for U.S. Appl. No. 12/916,174, 12 pages.

Response dated Jan. 11, 2012, for U.S. Appl. No. 12/916,046, 8 pages.

Advisory Action dated Jan. 31, 2012, U.S. Appl. No. 12/916,174, 3 pages.

Notice of Appeal dated Feb. 9, 2012, for U.S. Appl. No. 12/916,174, 1 page.

Pre-Appeal Brief Request for Review dated Feb. 9, 2012, for U.S. Appl. No. 12/916,174, 5 pages.

Notice of Panel Decision from Pre-Appeal Brief Review dated Mar. 14, 2012, for for U.S. Appl. No. 12/916,174, 2 pages.

Office Action dated Apr. 4, 2012, for U.S. Appl. No. 12/916,046, 12 pages.

Office Action dated Jun. 6, 2012, for U.S. Appl. No. 12/916,174, 10 pages.

Notice of Allowance dated May 11, 2012, for U.S. Appl. No. 12/916,119, 16 pages.

* cited by examiner

| A:INPUT | B:INPUT | A:WRITE | B:WRITE | A:RES | B:RES | $I_{READ}$ | AND FUNCTION | OR FUNCTION |
|---|---|---|---|---|---|---|---|---|
| LOGIC 0 | LOGIC 0 | POL-0 | POL-0 | HIGH | HIGH | LOW | LOGIC 0 | LOGIC 0 |
| LOGIC 0 | LOGIC 1 | POL-0 | POL-1 | HIGH | LOW | INT | LOGIC 0 | LOGIC 1 |
| LOGIC 1 | LOGIC 0 | POL-1 | POL-0 | LOW | HIGH | INT | LOGIC 0 | LOGIC 1 |
| LOGIC 1 | LOGIC 1 | POL-1 | POL-1 | LOW | LOW | HIGH | LOGIC 1 | LOGIC 1 |

US 8,427,197 B2

CONFIGURABLE REFERENCE CIRCUIT FOR LOGIC GATES

This disclosure relates to a reference circuit, and more particularly, to a reference circuit for logic gates.

BACKGROUND

Logic gates are fundamental to the design and implementation of integrated circuits and computer processors. One process technology that is commonly used to implement logic gates is a Complementary Metal-Oxide-Semiconductor (CMOS) process technology. In a typical CMOS implementation, a logic gate may be implemented by using a set of n-type metal oxide semiconductor field effect transistors (MOSFETs) along with a complementary set of p-type MOSFETs. Each logic gate typically has at least one n-type MOSFET and at least one p-type MOSFET associated with each logic input of the logic function. The MOSFETs are configured such that the output of the logic gate is pulled-up to a high voltage level or pulled-down to a low voltage level depending on the input values of the logic function.

SUMMARY

This disclosure describes examples of a configurable reference circuit that generates a reference current at selectable amplitudes. The amplitude of the reference current may cause a magnetic logic gate to operate as different combinational logic gates. In some examples, the configurable reference circuit may include a plurality of magnetoresistive devices. The amount of electrical impedance provided by the magnetoresistive devices may be configurable. The amplitude of the reference current may be based on the electrical impedances of the magnetoresistive devices.

In one example, this disclosure describes a method that comprises receiving, with a magnetic logic device, a function select signal that indicates a combinational logic function that is to be performed by the magnetic logic device on input values stored on the magnetic logic device. The method further includes configuring an amount of impedance provided by at least one of a plurality of magnetoresistive devices of a reference circuit of the magnetic logic device based at least on the combinational logic function that is to be performed by the magnetic logic device. The method also includes generating, with the reference circuit, a reference current whose amplitude is based at least on the amount of impedance provided by the at least one of the plurality of magnetoresistive devices of the reference circuit.

In another example, this disclosure describes an apparatus that comprises a magnetic logic device operable to receive a function select signal that indicates a combinational logic function that is to be performed by the magnetic logic device on input values stored on the magnetic logic device. The apparatus also includes a reference circuit that includes a plurality of magnetoresistive devices and is operable to generate a reference current whose amplitude is based at least on an amount of impedance provided by at least one of the plurality of magnetoresistive device. In the apparatus, the amount of impedance provided by the at least one of the plurality of magnetoresistive devices of the reference circuit is configured based at least on the combinational logic function that is to be performed by the magnetic logic device.

In another example, this disclosure describes an apparatus that comprises means for receiving, with a magnetic logic device, a function select signal that indicates a combinational logic function that is to be performed by the magnetic logic device on input values stored on the magnetic logic device. The apparatus further includes means for configuring an amount of impedance provided by at least one of a plurality of magnetoresistive devices of a reference circuit of the magnetic logic device based at least on the combinational logic function that is to be performed by the magnetic logic device. The apparatus also includes means for generating, with the reference circuit, a reference current whose amplitude is based at least on the amount of impedance provided by the at least one of the plurality of magnetoresistive devices of the reference circuit.

The details of one or more examples are set forth in the accompanying drawings and the description below. Other features, objects, and advantages will be apparent from the description and drawings, and from the claims.

DETAILED DESCRIPTION

Figure 1:
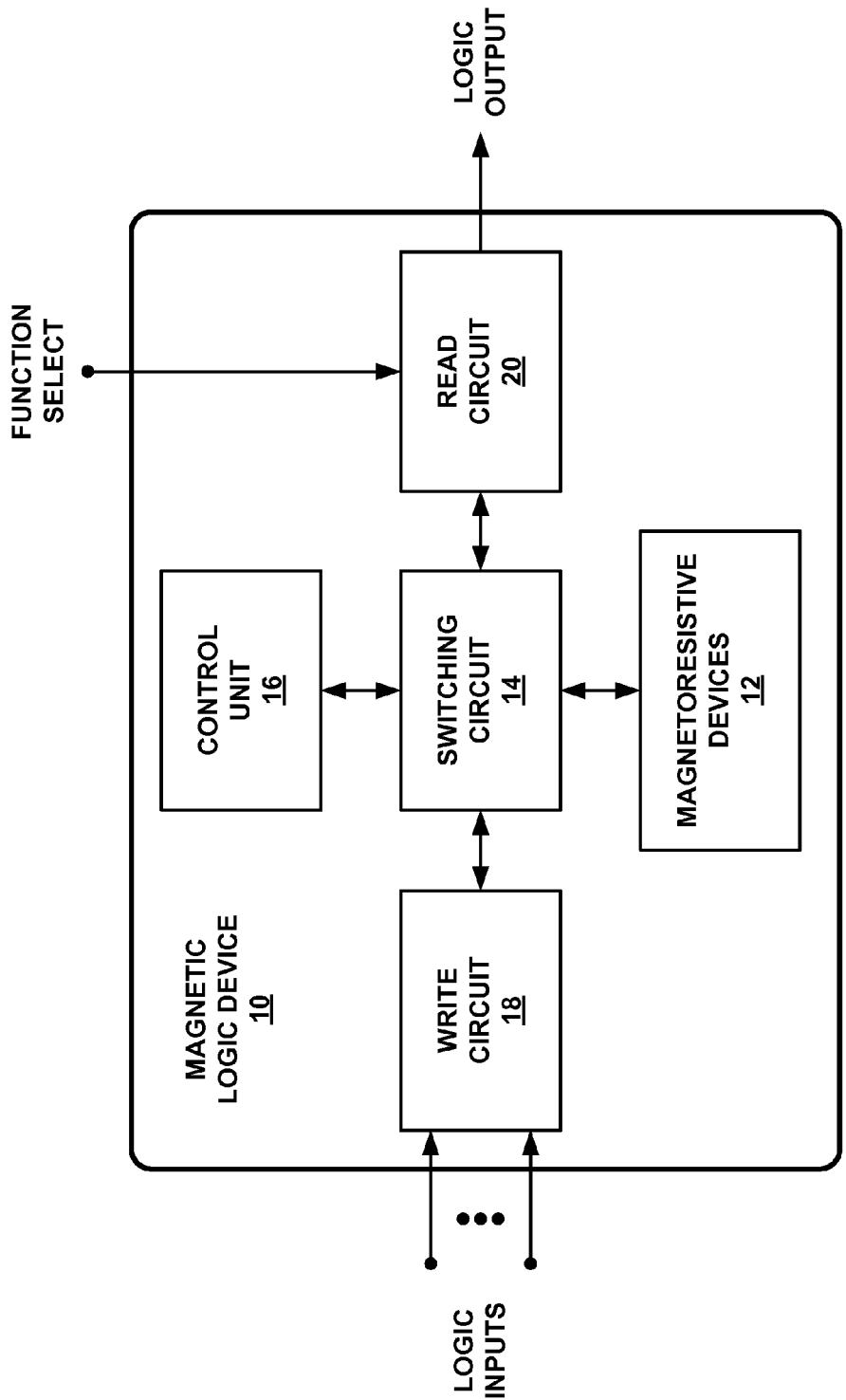
FIG. 1 is a block diagram illustrating an example magnetic logic device according to this disclosure.

Some of the examples described in the disclosure may be directed to a configurable reference circuit that generates a reference current at selectable amplitudes. The phrase "configurable reference circuit" generally means that the components of the reference circuit can be configured, e.g., at time of manufacture or during use, to generate the reference current at a desired amplitude. For example, the configurable reference circuit may include a plurality of magnetoresistive devices that determine the amplitude of the generated reference current. In some examples, the amount of impedance provided by each of the magnetoresistive devices may be configurable at time of manufacture or during use of the configurable reference circuit so as to generate the reference current at the desired amplitude.

In some examples, the reference current may cause a magnetic logic gate to operate as different, desired combinational logic gates. Examples of the combinational logic gates include, but are not limited to, an AND gate and an OR gate. The magnetic logic gate may be utilized for digital processing that generally requires different combinational logic functions. As one non-limiting example, the reference current may cause magnetic logic gates to operate as AND gates and OR gates for a two-bit adder.

A magnetic logic gate may include two or more magnetoresistive devices. During a write phase, a write circuit may program the magnetization states of the magnetoresistive devices to correspond to the logic input values of the combinational logic gate. During a read phase, the magnetoresistive devices may be electrically coupled in parallel to form a network of magnetoresistive devices. A voltage may be applied across the network of magnetoresistive devices to induce a read current to propagate through the magnetoresistive devices. The amplitude of the read current may be indicative of the magnetization states of the magnetoresistive devices in the magnetic logic gate.

A comparator circuit may compare the amplitude of the read current and the amplitude of the reference current generated by the configurable reference circuit. The logic output value of the comparator circuit may correspond to the value obtained when a desired combinational logic function is applied to the logic input values. By selecting the impedance values of the magnetoresistive devices of the reference circuit, the user may select the amplitude of the reference current such that the reference current causes the logic output value of the comparator circuit to correspond to the desired combinational logic function. For example, the user may configure the impedance values of the magnetoresistive devices of the reference circuit, during manufacture or during use, such that the amplitude of the generated reference current causes the magnetic logic gate to operate as an AND gate or as an OR gate.

The techniques described herein may be able to produce integrated circuits having reduced power consumption and/or increased chip density in comparison to integrated circuits that implement equivalent logic using a CMOS process technology. In contrast to transistor-based CMOS logic gates, the magnetic logic gates designed in accordance with this disclosure may be non-volatile, i.e., such gates may retain their state even if the logic gate is not receiving power. In addition, the techniques in this disclosure may be able to be monolithically integrated with conventional CMOS electronics.

FIG. 1 is a block diagram illustrating an example magnetic logic device 10 according to this disclosure. Magnetic logic device 10 is configured to receive two or more logic input values, and generate a logic output value in response to receiving the logic input values. Magnetic logic device 10 may perform a logic operation on the logic input values to generate the logic output value, such as, e.g., applying a combinational logic function to the logic input values to generate the logic output value. Magnetic logic device 10 may also be referred to herein as a "magnetic logic gate." Magnetic logic device 10 includes magnetoresistive devices 12, a switching circuit 14, a control unit 16, a write circuit 18, and a read circuit 20.

Magnetoresistive devices 12 may include two or more individual magnetoresistive devices. In some examples, magnetoresistive devices 12 may include an individual magnetoresistive device corresponding to each of the two or more logic input values of magnetic logic device 10, e.g., a digital input logic value one or a digital input logic zero. Each of the magnetoresistive devices may be configured to store a binary value as a magnetization state within the respective magnetoresistive device, and to vary the resistance between two terminals of the magnetoresistive device based on the magnetization state of magnetoresistive device. Because of the magnetization state-dependant resistances of magnetoresistive devices 12, when a voltage is applied across the terminals of a magnetoresistive device, a current may propagate through the magnetoresistive device having an amplitude that is indicative of the magnetization state of the magnetoresistive device.

Each of the magnetoresistive devices 12 may operate in a parallel magnetization state or an anti-parallel magnetization state. If a magnetoresistive device is operating in a parallel magnetization state, then the magnetoresistive device may have a relatively low resistance between the terminals of the magnetoresistive device. Thus, the parallel magnetization state may be alternatively referred to herein as a "low resistance state." Similarly, if the magnetoresistive device is operating in an anti-parallel magnetization state, then the magnetoresistive device may have a relatively high resistance between the terminals of magnetoresistive device. As such, the anti-parallel magnetization state may be alternatively referred to herein as a "high resistance state."

Each of the magnetoresistive devices 12 may be any device that is capable of storing a binary logic value as one of at least two different magnetization states. In some examples, magnetoresistive devices 12 may be magnetoresistive sandwich devices each having two outer ferromagnetic layers and an intermediate layer formed between the two outer ferromagnetic layers. For example, magnetoresistive devices 12 may be giant magnetoresistance (GMR) devices, and the intermediate layer may be a non-ferromagnetic conductive layer. In further examples, magnetoresistive devices may be magnetic tunnel junction (MTJ) devices or tunneling magnetoresistance (TMR) devices, and the intermediate layer may be an insulating barrier layer. The individual magnetoresistive devices within magnetoresistive devices 12 may be, but need not be, the same type of magnetoresistive device.

Magnetoresistive devices 12 may be electrically coupled to switching circuit 14. Depending on the state of switching circuit 14, magnetoresistive devices 12 may also be electrically coupled to write circuit 18 and/or read circuit 20.

In some examples, magnetoresistive devices 12 may be arranged to form an electrical network of magnetoresistive devices. The electrical network may vary depending on whether magnetic logic device 10 is operating in a write configuration or a read configuration. When magnetic logic device 10 is operating in a write configuration, each of the magnetoresistive devices in the network of magnetoresistive devices may be electrically coupled to a respective spin polarizer cell within write circuit 18. When magnetic logic device 10 is operating in a read configuration, the magnetoresistive devices may be electrically coupled in parallel to form a network of at least two magnetoresistive devices electrically coupled in parallel.

Switching circuit 14 is configured to switch magnetic logic device 10 between a write configuration and a read configuration depending on the current operating state of magnetic logic device 10. In some examples, switching magnetic logic device 10 between a write configuration and a read configuration may include switching magnetoresistive devices 12 between a write configuration and a read configuration. Switching circuit 14 may switch magnetic logic gate 10 to a particular configuration (e.g., a write configuration or a read configuration) based on control information (e.g., a control signal) received from control unit 16.

When switching circuit 14 switches magnetic logic device 10 into the write configuration, switching circuit 14 may couple write circuit 18 to magnetoresistive devices 12, and in some examples, decouple read circuit 20 from magnetoresistive devices 12. In addition, switching circuit 14 may switch magnetoresistive devices 12 into a write configuration. For example, switching circuit 14 may decouple the individual magnetoresistive devices 12 in the network of magnetoresistive devices 12 from each other such that the magnetoresistive devices 12 are not electrically coupled in parallel.

When switching circuit 14 switches magnetic logic device 10 into the read configuration, switching circuit 14 may couple read circuit 20 to magnetoresistive devices 12, and in some examples, decouple write circuit 18 from magnetoresistive devices 12. In addition, switching circuit 14 may switch magnetoresistive devices 12 into a read configuration. For example, switching circuit 14 may couple the individual magnetoresistive devices 12 to each other such that the magnetoresistive devices 12 form a network of magnetoresistive devices electrically coupled in parallel.

In further examples, in addition to or in lieu of coupling and decoupling write circuit 18 and read circuit 20 to magnetoresistive devices 12, switching circuit 14 may power-up write circuit 18 and power-down read circuit 20 as part of switching magnetic logic device 10 into a write configuration. Similarly, switching circuit 14 may power-down write circuit 18 and power-up read circuit 20 as part of switching magnetic logic device 10 into a read configuration.

Switching circuit 14 may be electrically coupled to write circuit 18, read circuit 20, and/or magnetoresistive devices 12. Switching circuit 14 may also be communicatively coupled to control unit 16.

Control unit 16 is configured to control the operation of magnetic logic device 10. In some examples, control unit 16 may be configured to cause write circuit 18 to program the magnetization states of magnetoresistive devices 12 such that the resulting programmed magnetization states correspond to respective logic input values of a combinational logic gate implemented by magnetic logic device 10, and to cause, in response to causing write circuit 18 to program the magnetization states, read circuit 20 to generate a logic output value for the combinational logic gate based on the programmed magnetization states of magnetoresistive devices 12.

Control unit 16 may provide control information to switching circuit 14 for controlling the configuration of magnetic logic gate 10. For example, control unit 16 may be implemented, in some examples, as a state machine having two or more states. When control unit 16 is within a first state (e.g., a "Write" state), control unit 16 may provide control information to switching circuit 14 directing switching circuit 14 to switch magnetic logic device 10 into a write configuration. When control unit 16 is within a second state (e.g., a "Read" state), control unit 16 may provide control information to switching circuit 14 directing switching circuit 14 to switch magnetic logic device 10 into a read configuration.

In some examples, magnetic logic device 10 may transition from the first state to the second state as part of the performance of a single logic operation, e.g., as part of the generation of a logic output value for the two or more logic input values. Automatically transitioning from the first state to the second state may, in some examples, refer to transitioning from the first to the second state based on an internal clock signal. Automatically transitioning from the first state to the second state may, in additional examples, refer to transitioning from the first to the second state based on a timing signal received from a device external to magnetic logic device 10 that directs control unit 16 to initiate the transition from one state to another state. Automatically transitioning from the first state to the second state may include automatically transitioning to one or more intermediate states between the first state and the second state.

Control unit 16 may be configured, in some examples, to transition to a third state (e.g., an "Idle" state) between logic operations and/or in response to a signal received from an device external to magnetic logic device 10. In such examples, control unit 16 may transition from the third state (e.g., "Idle" state) to the first state (e.g., "Write" state) in response to receiving an external signal directing magnetic logic gate 10 to initiate the performance of a logic operation.

The control information provided by control unit 16 may be indicative of the current operating state of control unit 16. For example, the control information may take the form of a combination of one or more bits with each bit combination corresponding to a respective state within control unit 16.

In some examples, control unit 16 may be implemented as a state machine. In further examples, control unit 16 may route an external control input directly to switching circuit 14 without additional circuitry. In such examples, an external device that generates the external control input may control the current state of switching circuit 14. Control unit 16 is communicatively coupled to switching circuit 14.

Write circuit 18 is configured to receive two or more logic input values for a combinational logic function that is to be performed by magnetic logic device 10, and to program magnetoresistive devices 12 such that a resulting programmed magnetization state for each of the magnetoresistive devices 12 corresponds to a respective logic input value of the combinational logic function. Write circuit 18 is electrically coupled to switching circuit 14 and to the logic input terminals of magnetic logic gate 10. In addition, when magnetic logic gate 10 has been switched into a write configuration, write circuit 18 may also be electrically coupled to magnetoresistive devices 12.

In some examples, write circuit 18 may be configured to program the magnetization states of magnetoresistive devices 12 by generating a plurality of spin-polarized currents with each spin-polarized current having a spin direction that corresponds to a respective logic input value of the combinational logic function. For example, for each logic input value, write circuit 18 may generate a spin-polarized current having a first spin direction (e.g., a spin-down direction) when the respective logic input value is a logic zero (i.e., a binary "0"). Similarly, write circuit 18 may generate a spin-polarized current having a second spin direction (e.g., a spin-up direction) when the respective logic input value is a logic one (i.e., a binary "1"). The second spin direction may be a spin direction that is opposite that of the first spin direction. Write circuit 18 may use one or more direction-specific spin filters to generate the spin-polarized currents.

Write circuit 18 may apply the spin-polarized currents to magnetoresistive devices 12 to program the magnetization states of magnetoresistive devices 12 such that a resulting programmed magnetization state of each of the magnetoresistive devices 12 corresponds to a respective logic input value of the combinational logic function. In some examples, for one or more of the logic input values, write circuit 18 may apply a respective spin-polarized current to a first terminal of a respective magnetoresistive device that is electrically coupled to a free ferromagnetic layer of the magnetoresistive device. In additional examples, for one or more of the logic input values, write circuit 18 may apply a respective spin-polarized current to a second terminal of a respective magnetoresistive device that is electrically coupled to a fixed ferromagnetic layer of the magnetoresistive device. In any case, the application of the spin-polarized currents to magnetoresistive devices 12 programs the magnetization states of each of magnetoresistive devices 12 to one of two magnetization states based on the spin direction of the spin polarized current. This technique of programming the magnetization states of magnetoresistive devices 12 may be referred to as a "spin torque transfer (STT)" technique.

In additional examples, write circuit 18 may use other techniques for programming the magnetization states of magnetoresistive devices 12. For example, write circuit 18 may use inductive techniques to program the magnetization states. In such examples, write circuit 18 may apply a write current to a write current structure situated proximate to the free layer of a magnetoresistive device. The write current need not necessarily be spin-polarized as described in the previous example. The electron-flow direction for a particular write current may be dependent on the logic input value for a respective logic input. For example, if the logic input value is a logic zero, then the electron-flow direction of the current may be negative. Otherwise, if the logic input value is a logic one, then the electron-flow direction of the current may be positive.

The write current structure may be configured to inductively program the magnetization state of the corresponding magnetoresistive device by producing a magnetic field having one of two magnetic field directions depending on the electron-flow direction of the current. The magnetic field causes the magnetization direction of the free layer to situate in one of two directions, and hence, programs the magnetization state of the magnetoresistive device.

Read circuit 20 is configured to generate a logic output value for a combinational logic function implemented by magnetic logic device 10 based on the programmed magnetization states of magnetoresistive devices 12. In some examples, read circuit 20 may also select a particular logic function from a set of logic functions for application to the logic inputs based on the function select input received by magnetic logic gate 10.

When magnetic logic device 10 is operating in the read configuration, magnetoresistive devices 12 may be electrically coupled in parallel to form a network of magnetoresistive devices electrically coupled in parallel. Read circuit 20 may be configured to apply a bias voltage across the network of magnetoresistive devices. For example, read circuit 20 may apply a voltage between a first terminal at a first end of the network of magnetoresistive devices and a second terminal at a second end of the network of magnetoresistive devices. The first terminal of the network of magnetoresistive devices may be electrically coupled to respective first terminals of each of the magnetoresistive devices. The second terminal of the network of magnetoresistive devices may be electrically coupled to respective second terminals of each of the magnetoresistive devices. The second terminals of each of the magnetoresistive devices may be electrically coupled to a ferromagnetic layer of the respective magnetoresistive device opposite the ferromagnetic layer to which the first terminal for the device is electrically coupled.

The applied voltage may induce branch currents to propagate through the individual magnetoresistive devices. Because the magnetoresistive devices are electrically coupled in parallel, the branch currents combine to produce an aggregate read current at the first and second terminals of the network. The amplitude of the read current may be dependent upon each of the magnetization states in the network of magnetoresistive devices. Read circuit 20 may be configured to generate the logic output value based on the amplitude of the read current. For example, read circuit 20 may compare the amplitude of the read current to a reference current to determine a logic output value for a particular logic function.

As described in more detail, read circuit 20 may include a configurable reference circuit and a comparator circuit. The comparator circuit may receive as its inputs a reference current generated by the configurable reference circuit and the read current. The comparator circuit may compare the amplitudes of each of these currents, and output a logic value based on the comparison. The output of the comparator circuit may be the output of read circuit 20.

As one example, if the amplitude of the reference current is greater than the amplitude of the read current, the comparator circuit may output a logic zero. If the amplitude of the reference circuit is less than the amplitude of the read current, the comparator may output a logic one. In an alternate example, the opposite may be true. For instance, in this alternate example, if the amplitude of the reference current is greater than the amplitude of the read current, the comparator circuit may output a logic one, and if the amplitude of the reference current is less than the amplitude of the read current, the comparator circuit may output a logic one.

The amplitude of the reference current generated by the configurable reference circuit may be selectable at manufacture or during use of magnetic logic device 10. By selecting an appropriate amplitude of the reference current, magnetic logic device 10 may be capable of operating as different combinational logic gates, e.g., AND gates or OR gates, as described in more detail.

To generate the reference current, the configurable reference circuit may include a plurality of magnetoresistive devices, separate from magnetoresistive devices 12. The amplitude of the reference current generated by the reference circuit may be based on the amount impedance provided by the plurality of magnetoresistive devices. To generate the reference current at selectable amplitudes, the amount of impedance provided by the plurality of magnetoresistive devices of the reference circuit may be configurable at the time of manufacture or during use.

As one example, magnetic logic device 10 may perform a predetermined logic function. In such examples, read circuit 20 may compare the amplitude of the read current to a predetermined amplitude of the reference current corresponding to the predetermined logic function to determine the logic output value. In this example, the amount of impedance provided by the plurality of magnetoresistive devices of the reference circuit may be predetermined at the time of manufacture to generate the reference current at the predetermined amplitude.

As another example, magnetic logic device 10 may perform a logic function that is selected from a predetermined set of logic functions. In this example, read circuit 20 may be configured to receive a function select parameter, and to select a logic function from a predetermined group of logic functions based on the function select parameter. Read circuit 20 may select an amplitude for the reference current corresponding to the selected logic function, and compare the amplitude of the read current to the selected amplitude for the reference current to determine the logic output value. In this example, the amount of impedance provided by the plurality of magnetoresistive devices of the reference circuit may be determined during use to generate the selected amplitude for the reference current.

The predetermined set of logic functions may include logic functions, such as, e.g., an AND logic function, an OR logic function, a NAND logic function, a NOR logic function, an XOR logic function, an XNOR logic function, and/or a VOTING-OR logic function. A voting-OR logic function may produce a logic one output value if the number of logic inputs having a value of logic one is greater than a selected threshold for the function. Otherwise, the voting-OR logic function may produce a logic zero output value.

In any case, read circuit 20 is configured to map the read current amplitude to a corresponding logic output value to generate a logic output value for the logic function. The logic output value may be a binary value (i.e., a logic one or logic zero) indicative of the result obtained from applying the selected logic function to the logic input values.

As described above, read circuit 20 may include a configurable reference circuit and a comparator circuit. Read circuit 20 may include other components as well, such as, but not limited to a voltage source to induce the read current, an operational amplifier, a transimpedance amplifier, a digital-to-analog converter, and/or other circuitry configured to generate a read current and map the read current amplitude to a logic output value. It should be understood that not all of these illustrative components of read circuit 20 are required in every example of read circuit 20.

Read circuit 20 is electrically coupled to switching circuit 14. In addition, when magnetic logic gate 10 has been switched into a read configuration, read circuit 18 may also be electrically coupled to magnetoresistive devices 12.

The operation of magnetic logic gate 10 will now be described. Control unit 16 initiates a logic operation by transitioning to a first state (e.g., a "Write" state). When operating in the first state, control unit 16 causes magnetic logic device 10 to operate in a write configuration. For example, control unit 16 may provide control information to switching circuit 14 directing switching circuit 14 to switch magnetic logic device 10 into a write configuration.

Upon receiving the control information from control unit 16, switching circuit 14 switches magnetic logic device 10 into a write configuration. For example, switching circuit 14 may couple write circuit 18 to magnetoresistive device 12. Switching circuit 14 may also switch magnetoresistive devices 12 into a write configuration, which in some examples, may include configuring magnetoresistive devices 12 such that the magnetoresistive devices are not electrically coupled to each other in parallel.

Write circuit 18 receives two or more logic input values for a combinational logic function and programs the magnetization states of magnetoresistive devices 12 such that the resulting magnetization states correspond to respective logic input values for the logic function. For example, if the logic function includes two logic input values, write circuit 18 may program the magnetization states of two magnetoresistive devices 12 such that each magnetization state corresponds to a respective one of the logic input values.

After the magnetization states have been programmed to correspond to the logic input values, control unit 16 transitions from the first state (e.g., the "Write" state) to the second state (e.g., the "Read" state). In some examples, control unit 16 may transition to the second state in response to an external timing signal. In further examples, control unit 16 may automatically transition to the second state after a predetermined period of time. When operating in the second state, control unit 16 causes magnetic logic device 10 to switch from operating in the write configuration to operating in a read configuration. For example, in response to operating in the write configuration, control unit 16 may provide control information to switching circuit 14 directing switching circuit 14 to switch magnetic logic device 10 from the write configuration to a read configuration.

Upon receiving the control information from control unit 16, switching circuit 14 switches magnetic logic device 10 into a read configuration. In some examples, switching circuit 14 may decouple write circuit 18 from magnetoresistive device 12, and couple read circuit 20 to magnetoresistive device 12. Switching circuit 14 may also switch magnetoresistive devices 12 into a read configuration, which in some examples, may include configuring magnetoresistive devices 12 such that the magnetoresistive devices are electrically coupled in parallel to form a network of magnetoresistive devices electrically coupled in parallel.

Read circuit 20 generates a logic output value for a logic function based on the programmed magnetization state of magnetoresistive device 12. The logic function may be a predetermined logic function or selected based on the function select input. In some examples, read circuit 20 may apply a voltage across the network of magnetoresistive devices, which causes a read current to propagate through the network. Portions of the read current may propagate through different branches of the network. The amplitude of the read current varies depending on the programmed magnetization states of magnetoresistive devices 12. Read circuit 20 maps the amplitude of the read current to a logic output value. The logic operation is now complete.

After completing the logic operation, control unit 16 may, in some examples, transition from the second state (e.g., the "Read" state) to the first state (e.g., the "Write" state) to commence performance of a subsequent logic operation. In additional examples, control unit 16 may transition to a third state (e.g., the "Idle" state) to wait until control unit 16 receives instructions from an external device to commence another logic operation.

Figure 2A:
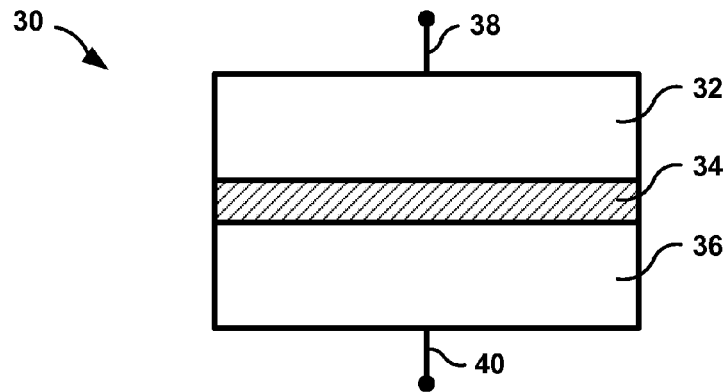
FIG. 2A is a conceptual diagram illustrating an example magnetoresistive device according to this disclosure for use within the magnetic logic devices of this disclosure.

FIG. 2A is a conceptual diagram illustrating an example magnetoresistive device 30 for use within any of the magnetic logic devices of this disclosure. For example, the example magnetoresistive device 30 may be substantially similar to each one of magnetoresistive devices 12 (FIG. 1). As another example, the example magnetoresistive device 30 may be substantially similar to each one of the plurality of magnetoresistive devices of the reference circuit of read circuit 20 (FIG. 1).

Magnetoresistive device 30 is configured to vary a terminal-to-terminal resistance based on a magnetization state of the magnetoresistive device. Magnetoresistive device 30 may also be configured to receive a spin-polarized current and to transition or remain in a magnetization state corresponding to the spin direction of the spin-polarized current. In addition, magnetoresistive device 30 may be configured to receive an applied voltage across the terminals of magnetoresistive device 30 and generate a current having an amplitude that is indicative of the magnetization state of magnetoresistive device 30 in response to the applied voltage. Magnetoresistive device 30 includes a free layer 32, an intermediate layer 34, a fixed layer 36, and terminals 38, 40.

Free layer 32 includes ferromagnetic materials, such as, e.g., nickel, iron, cobalt, binary and ternary alloys of Ni, Fe, and Co, permalloys, or any other material that has ferromagnetic properties. Fixed layer 36 includes ferromagnetic materials, such as, e.g., nickel, iron, cobalt, nickel alloys, iron alloys, cobalt alloys, permalloys, or any other material that has ferromagnetic properties. Antiferromagnetic materials may also be applied, such as iron manganese and other manganese alloys. In some examples, free layer 32 and fixed layer 36 may include thin-film ferromagnetic materials. Although free layer 32 and fixed layer 36 are described in the example magnetoresistive device 30 of FIG. 2A as including ferromagnetic materials, in other examples, one or more of free layer 32 and fixed layer 36 may include ferrimagnetic materials in addition to or in lieu of the ferromagnetic materials.

Free layer 32 is configured to have a magnetization direction that can be altered by application of a spin-polarized current to one or both of terminals 38, 40. Fixed layer 36 is configured to have a magnetization direction that is substantially fixed during the performance of logic operations. Fixed layer 36 may alternatively be referred to as a pinned layer.

In order to achieve the desired behaviors for free layer 32 and fixed layer 36, a first type of ferromagnetic material may be selected for free layer 32, and a second type of ferromagnetic material may be selected for fixed layer 36. For example, the ferromagnetic material selected for fixed layer 36 may require a higher amplitude of spin-polarized current to alter the magnetization direction of the material than the amplitude of spin-polarized current required to alter the magnetization direction of the ferromagnetic material selected for free layer 32. As another example, the ferromagnetic material selected for fixed layer 36 may require a higher device temperature to alter the magnetization direction of the material than the device temperature required to alter the magnetization direction of the ferromagnetic material selected for free layer 32.

Intermediate layer 34 is disposed between free layer 32 and fixed layer 36. In some examples, magnetoresistive device 30 may take the form of a giant magnetoresistance (GMR) device. In such examples, intermediate layer 34 may be referred to as a non-ferromagnetic conductive layer or a non-ferromagnetic spacer layer. The non-ferromagnetic layer may include non-ferromagnetic conductor materials, such as, e.g., copper, chromium, aluminum, respective alloys of the preceding metals, or the like.

In additional examples, magnetoresistive device 30 may take the form of a magnetic tunnel junction (MTJ) device and/or a tunneling magnetoresistance (TMR) device. In such examples, intermediate layer 34 may be referred to as an insulating layer or a tunnel barrier layer. The insulating layer may include insulating materials, such as, e.g., aluminum oxide, magnesium oxide, other types of oxides, a nitride, or any other material having insulating properties.

Terminal 38 is electrically coupled to free layer 32, and in some examples, may be in direct contact with free layer 32. Terminal 40 is electrically coupled to fixed layer 36, and in some examples, may be in direct contact with fixed layer 36. As used herein, terminal 38 may be referred to as a "free layer terminal" and terminal 40 may be referred to as a "fixed layer terminal."

As used herein, the magnetization state of magnetoresistive device 30 may refer to whether the device is configured in a parallel magnetization state or an anti-parallel magnetization state. The magnetization state of magnetoresistive device 30 is defined by the relative orientation of the magnetization directions of free layer 32 and fixed layer 36. The magnetization direction of each of free layer 32 and fixed layer 36 may refer to the direction of the magnetic moment of the ferromagnetic material for the respective layer. When the magnetization directions (i.e., magnetic moments) of free layer 32 and fixed layer 36 are aligned in the same direction, then magnetoresistive device 30 is said to be in a parallel magnetization state, or alternatively, a low resistance state. When the magnetization directions (i.e., magnetic moments) of free layer 32 and fixed layer 36 are oriented in opposite directions (i.e., not aligned in the same direction), then magnetoresistive device 30 is said to be in an anti-parallel magnetization state, or alternatively, a high resistance state.

When multiple instances of magnetoresistive device 30 are used to form a network of magnetoresistive devices, the terminals of adjacent magnetoresistive devices may be electrically coupled to each other. For example, a free layer terminal 38 of a first magnetoresistive device in the network may be electrically coupled to a free layer terminal 38 of a second magnetoresistive device in the network, and a fixed layer terminal 40 of the first magnetoresistive device may be electrically coupled to a fixed layer terminal 40 of the second magnetoresistive. As another example, a free layer terminal 38 of a first magnetoresistive device in the network may be electrically coupled to a fixed layer terminal 40 of a second magnetoresistive device in the network, and a fixed layer terminal 40 of the first magnetoresistive device may be electrically coupled to a free layer terminal 38 of the second magnetoresistive device.

Figure 2B:
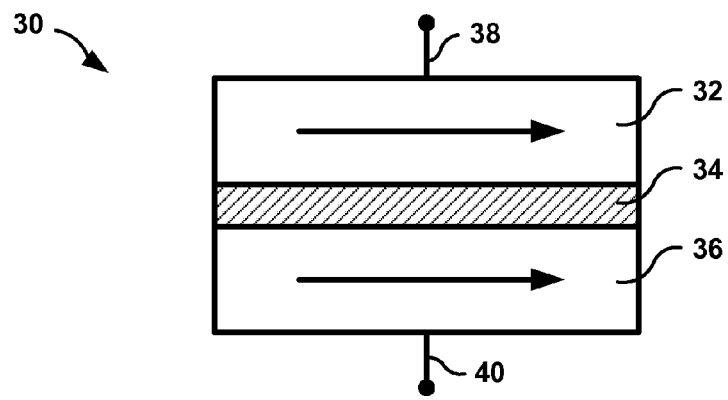
FIG. 2B is a conceptual diagram illustrating the example magnetoresistive device of FIG. 2A in a parallel magnetization state according to this disclosure.

FIG. 2B is a conceptual diagram illustrating the example magnetoresistive device 30 of FIG. 2A in a parallel magnetization state according to this disclosure. In FIG. 2B, free layer 32 and fixed layer 36 each have an arrow representative of the magnetization direction of the layers. As shown in FIG. 2B, the arrows point in the same direction representing that the magnetization direction of free layer 32 is the same as the magnetization direction of fixed layer 36, which means that magnetization device is in a parallel magnetization state.

Figure 2C:
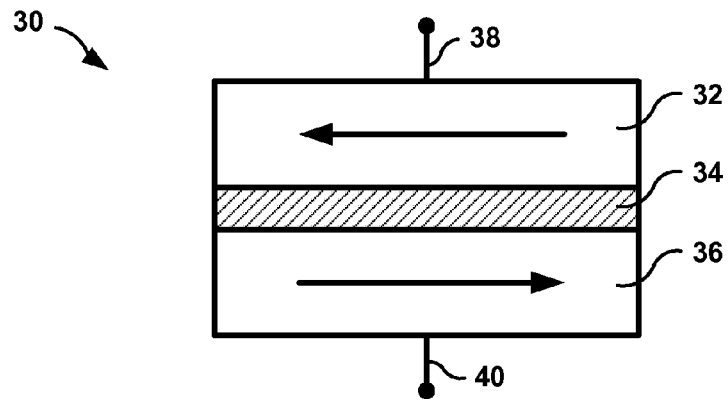
FIG. 2C is a conceptual diagram illustrating the example magnetoresistive device of FIG. 2A in an anti-parallel magnetization state according to this disclosure.

FIG. 2C is a conceptual diagram illustrating the example magnetoresistive device of FIG. 2A in an anti-parallel magnetization state according to this disclosure. FIG. 2C includes arrow representative of the magnetization direction of the layers similar to that depicted in FIG. 2B except that the arrows are oriented in opposite directions, which means the that magnetization device is in an anti-parallel magnetization state.

If magnetoresistive device 30 is a GMR device, then a parallel magnetization state may cause less electron scattering at the interfaces and longer mean free paths for the electrons as compared to the anti-parallel magnetization state. The reduced electron scattering and increased mean free paths effectively cause a reduction in the resistance between terminals 38 and 40 (i.e., a low resistance state). Similarly, when the GMR device is in an anti-parallel magnetization state, electron scattering may increase, and mean free paths for the electrons may decrease causing an increase in the resistance between terminals 38 and 40 (i.e., a high resistance state).

If magnetoresistive device 30 is an MTJ or TMR device, then a parallel magnetization state may increase the likelihood of electrons tunneling through barrier layer 34. The increased likelihood of tunneling effectively causes a reduction in the resistance between terminals 38 and 40 (i.e., a low resistance state). Similarly, when the MTJ or TMR device is in an anti-parallel magnetization state, the likelihood of electrons tunneling through barrier layer 34 may decrease thereby causing an increase in the resistance between terminals 38 and 40 (i.e., a high resistance state).

In some examples, the magnetization direction of free layer 32, and consequently, the magnetization state of magnetoresistive device 30 may be altered by applying a spin-polarized current having a particular spin direction to one or both of terminals 38 and 40. If the spin direction of the spin-polarized current is in a first direction (e.g., spin-up), then the magnetization direction of free layer 32 may be set to a first direction (e.g., parallel). If the spin direction of the spin-polarized current is in a second direction (e.g., spin-down), then the magnetization direction of free layer 32 may be set to a second direction (e.g., anti-parallel). In additional examples, the magnetization direction of free layer 32 may be altered using known techniques, such as, e.g., inductive techniques.

The techniques in this disclosure are not limited to the use of magnetoresistive devices as shown and described above with respect to FIGS. 2A-2C. Other types of magnetoresistive devices may also be used to implement the techniques of this disclosure.

Figure 3:
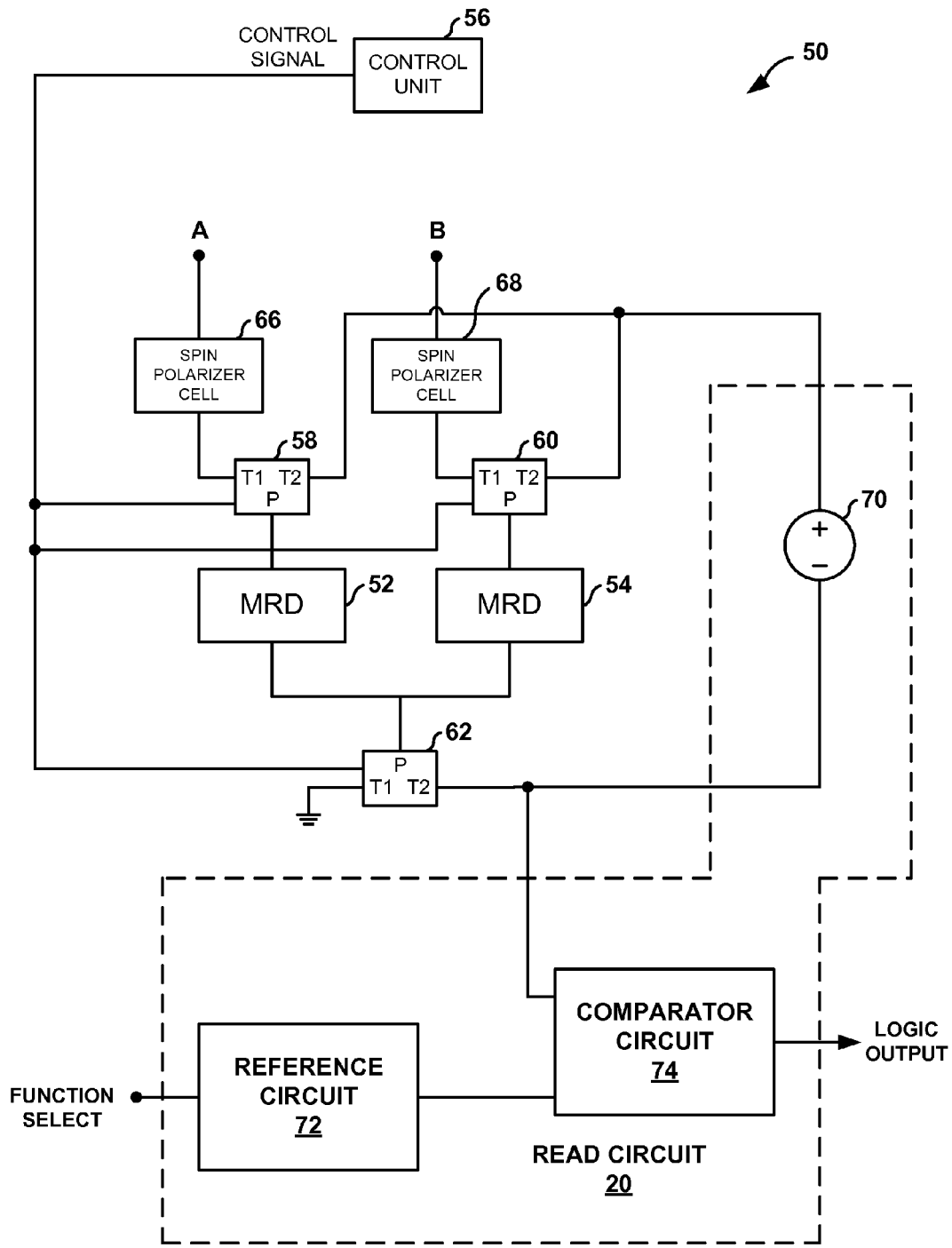
FIG. 3 is a schematic diagram illustrating an example two-input magnetic logic device according to this disclosure.

FIG. 3 is a schematic diagram illustrating an example two-input magnetic logic device 50 according to this disclosure. Magnetic logic device 50 is configured to receive two logic input values, and to generate a logic output value in response to receiving the logic input values. Magnetic logic device 50 may perform a logic operation on the logic input values to generate the logic output value, such as, e.g., applying a two-input combinational logic function to the logic input values to generate the logic output value. In some examples, magnetic logic device 50 may be used to form magnetic logic device 10 illustrated in FIG. 1. Magnetic logic device 50 includes magnetoresistive devices (MRDs) 52, 54, a control unit 56, switching modules 58, 60, 62, spin polarizer cells 66, 68, a bias voltage source 70, and a read circuit 20. Read circuit 20 may be substantially similar to read circuit 20 of FIG. 1. As illustrated, read circuit 20 may include bias voltage source 70, reference circuit 72, which may be a configurable reference circuit, and comparator circuit 74.

In some examples, MRDs 52, 54 may correspond to magnetoresistive devices 12 described above with respect to FIG. 1. When operating in the read configuration, MRDs 52, 54 may form a network of magnetoresistive devices electrically coupled in parallel. Switching modules 58, 60, 62 may be used to form switching circuit 14 described above with respect to FIG. 1. In further examples, spin polarizer cells 66, 68 may be used to form write circuit 18 described above with respect to FIG. 1.

Control unit 56 is configured to control the configuration and operation of magnetic logic device 50. Control unit 56 is electrically coupled to switching modules 58, 60, 62 and provides a control signal to switching modules 58, 60, 62 for controlling the switching state of switching modules 58, 60, 62 and magnetic logic device 50. The operation of control unit 56 may be substantially similar to the operation of control unit 16 described above with respect to FIG. 1, and thus will not be described in further detail in the interest of brevity and to avoid redundancy.

MRDs 52, 54 are each configured to store a binary value as a magnetization state, and to vary the resistance between the two terminals of the respective MRD based on the magnetization state the MRD. MRDs 52, 54 may be implemented as any type of magnetoresistive device. For example, MRDs 52, 54 may be any combination of GMR, TMR, and/or MTJ devices in accordance with the example magnetoresistive device illustrated in FIGS. 2A-2C. A first terminal of MRD 52 is electrically coupled to switching module 58, and a second terminal of MRD 52 is electrically coupled to switching module 62. Similarly, a first terminal of MRD 54 is electrically coupled to switching module 60, and a second terminal of MRD 54 is electrically coupled to switching module 62.

The free layer and fixed layer of MRDs 52, 54 may be oriented in several possible orientations. In some examples, switching modules 58, 60 may be electrically coupled to respective free layer terminals 38 of MRDs 52, 54, and switching module 62 may be electrically coupled to respective fixed layer terminals 40 of MRDs 52, 54. In additional examples, switching modules 58, 60 may be electrically coupled to respective fixed layer terminals 40 of MRDs 52, 54, and switching module 62 may be electrically coupled to respective free layer terminals 38 of MRDs 52, 54. In further examples, switching module 58 may be electrically coupled to a free layer terminal 38 of MRD 52, switching module 60 may be electrically coupled to a fixed layer terminal 40 of MRD 54, and switching module 62 may be electrically coupled to a fixed layer terminal 40 of MRD 52 and a free layer terminal of MRD 54. In more examples, switching module 58 may be electrically coupled to a fixed layer terminal 40 of MRD 52, switching module 60 may be electrically coupled to a free layer terminal 38 of MRD 54, and switching module 62 may be electrically coupled to a free layer terminal 38 of MRD 52 and a fixed layer terminal 40 of MRD 54.

Control unit 56 is configured to provide a control signal indicative of the operating state of magnetic logic device 50. The control signal may be used to control the configuration of switching modules 58, 60, 62. The control signal may be a single bit indicating either a "Write" state (e.g., logic zero) or a "Read" state (e.g., logic one). Control unit 56 is communicatively coupled to switching modules 58, 60, 62.

Switching modules 58, 60, 62 are configured to receive the control signal from control unit 56, and to configure magnetic logic device 50 into a write configuration or a read configuration based on the control signal. Switching modules 58, 60, 62 are each communicatively coupled to control unit 56.

Switching module 58 includes a first throw (T1) terminal that is electrically coupled to a spin-polarized current output terminal of spin polarizer cell 66, a second throw (T2) terminal that is electrically coupled to a positive terminal of bias voltage source 70, and a pole (P) terminal that is electrically coupled to a first terminal of MRD 52. Switching module 60 includes a first throw (T1) terminal that is electrically coupled to a spin-polarized current output terminal of spin polarizer cell 68, a second throw (T2) terminal that is electrically coupled to a positive terminal of bias voltage source 70, and a pole (P) terminal that is electrically coupled to a first terminal of MRD 54. Switching module 62 includes a T1 terminal that is electrically coupled to a ground terminal, a T2 terminal that is electrically coupled to a first terminal of comparator circuit 74, and a P terminal that is electrically coupled to second terminals of MRDs 52, 54. Although the T1 terminal of switching module 62 is depicted in the example magnetic logic device 50 of FIG. 3 as being directly coupled to the ground terminal, in other examples, any number of intervening components and/or load networks may be placed between the ground terminal and the T1 terminal of switching module 62.

If the control signal indicates that the current operating state for magnetic logic device 50 is a "Write" state, then switching modules 58, 60, 62 may electrically couple the respective T1 terminals to respective P terminals for each of switching modules 58, 60, 62 and decouple respective T2 terminals from the respective P terminals for each of switching modules 58, 60, 62 thereby placing magnetic logic device 50 into a write configuration. On the other hand, if the control signal indicates that the current state for magnetic logic device 50 is a "Read" state, then switching modules 58, 60, 62 may electrically couple the respective T2 terminals to respective P terminals for each of switching modules 58, 60, 62 and decouple respective T1 terminals from respective P terminals for each of switching modules 58, 60, 62 thereby placing magnetic logic device 50 into a read configuration.

Spin polarizer cells 66, 68 are each configured to receive a respective logic input value for a combinational logic function, and to generate a respective spin-polarized current having a spin direction that corresponds to the logic input value. Spin polarizer cells 66 may generate a spin-polarized current at a spin-polarized current output terminal that is electrically coupled to the T1 terminal of switching module 58. Similarly, spin polarizer cell 68 may generate a spin-polarized current at a spin-polarized current output terminal that is electrically coupled to the T1 terminal of switching modules 60. Spin polarizer cells 66, 68 may apply the spin-polarized current to MRDs 52, 54, respectively, to program the magnetization states of MRDs 52, 54 when magnetic logic device 50 is operating in a in a "Write" state.

Bias voltage source 70 is configured to apply a bias voltage across MRDs 52, 54 when magnetic logic device 50 is operating in a "Read" state. The bias voltage may induce a read current to flow through the network of MRDs. For example, the read current may flow through the network of MRDs and into read circuit 20, as illustrated in more detail in FIG. 6.

In some examples, the amplitude of the read current may be less than the amplitude of the spin-polarized current applied to MRDs 52, 54 by spin-polarizer cells 66, 68. In further examples, the amplitude of the read current may be less than the minimum amplitude of current needed to change the magnetization state of MRDs 52, 54. Because the resistance of each of MRDs 52, 54 is dependent upon the magnetization state of the respective MRD, the amplitude of the resulting read current is also dependent on the magnetization states of both of MRDs 52, 54.

Bias voltage source 70 includes a first terminal (e.g., a positive terminal) that is electrically coupled to the T2 terminal of switching modules 58 and 60, and a second terminal (e.g., a negative terminal) that is electrically coupled to a terminal of comparator circuit 74.

It should be noted that the configuration of bias voltage source 70 illustrated in magnetic logic device 50 of FIG. 3 is merely one example. In general, bias voltage source 70 may have positive and negative terminals configured in any manner that allows for a bias voltage to be applied across each of MRDs 52 and 54. For example, the negative terminal of bias voltage source 70 may be electrically coupled to a conductor located between read circuit 20 and one or both of MRDs 52 and 54. As another example, the positive and negative terminals of bias voltage source 70 may be electrically coupled to opposite terminals of each of MRDs 52 and 54 such that the bias voltage is not applied through switches 58, 60 and 62. Other examples are also possible.

Comparator circuit 74 may receive the read current and the reference current generated by reference circuit 72. Comparator circuit 74 may compare the amplitude of the read current with the amplitude of the reference current. Based on the comparison, comparator circuit 74 may output a logic output that corresponds to a selected combinational logic function applied to the input values stored in MRD 52 and MRD 54.

Read circuit 20 may receive the selected combinational logic function via a function select signal, as illustrated in FIG. 3. For example, the function select signal may indicate whether magnetic logic device 50 should operate as an AND gate or as an OR gate. Based on the received function select signal, reference circuit 72 may generate the reference current at the appropriate amplitude. For instance, a first amplitude of reference circuit 72 may cause comparator circuit 74 to output a logic output that corresponds to a logic output of an AND gate whose input values are the values stored in MRD 52 and MRD 54. A second amplitude of reference circuit 72 may cause comparator circuit 74 to output a logic output that corresponds to a logic output of an OR gate whose input values are the values stored in MRD 52 and MRD 54. In this example, based on the function to be performed by magnetic logic device 50, as indicated by the function selects signal, reference circuit 72 may output a reference current with either the first amplitude or the second amplitude. In this manner, the function select signal may cause magnetic logic device 50 to operate as an AND gate or as an OR gate. The functionality of reference circuit 72 and comparator circuit 74 is described in greater detail with respect to FIG. 6.

During operation, magnetic logic device 50 switches between a write configuration and a read configuration at the direction of control unit 56. A single logic operation may include writing the two logic input values to MRDs 52, 54, respectively, when magnetic logic device 50 is operating in the write configuration, and generating a logic output value based on the magnetization states of MRDs 52, 54 when magnetic logic device 50 operating in the read configuration.

Figure 4A:
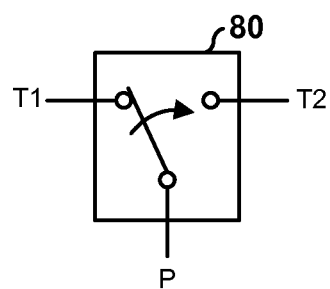
FIGS. 4A and 4B are schematic diagrams illustrating example switching modules for use in the magnetic logic device of FIG. 3 according to this disclosure.
Figure 4B:
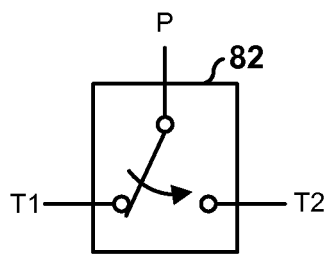

FIGS. 4A and 4B are schematic diagrams illustrating example switching modules 80, 82 for use in the magnetic logic device of FIG. 3 according to this disclosure. As shown in examples of FIGS. 4A and 4B, switching modules 80, 82 are implemented as single-pole double-throw (SPDT) switches. During a first switching state, switching modules 80, 82 electrically couple respective T1 terminals to respective P terminals and decouple respective T2 terminals from respective P terminals. During a second switching state, switching modules 80, 82 electrically couple respective T2 terminals to respective P terminals and decouple respective T1 terminals from respective P terminals. In other examples, switching modules 80, 82 may be implemented as "on-off-on" switches where switching modules 80, 82 may be set to a third switching state that decouples both the T1 terminals from the P terminals and the T2 terminals from the P terminals.

Figure 5:
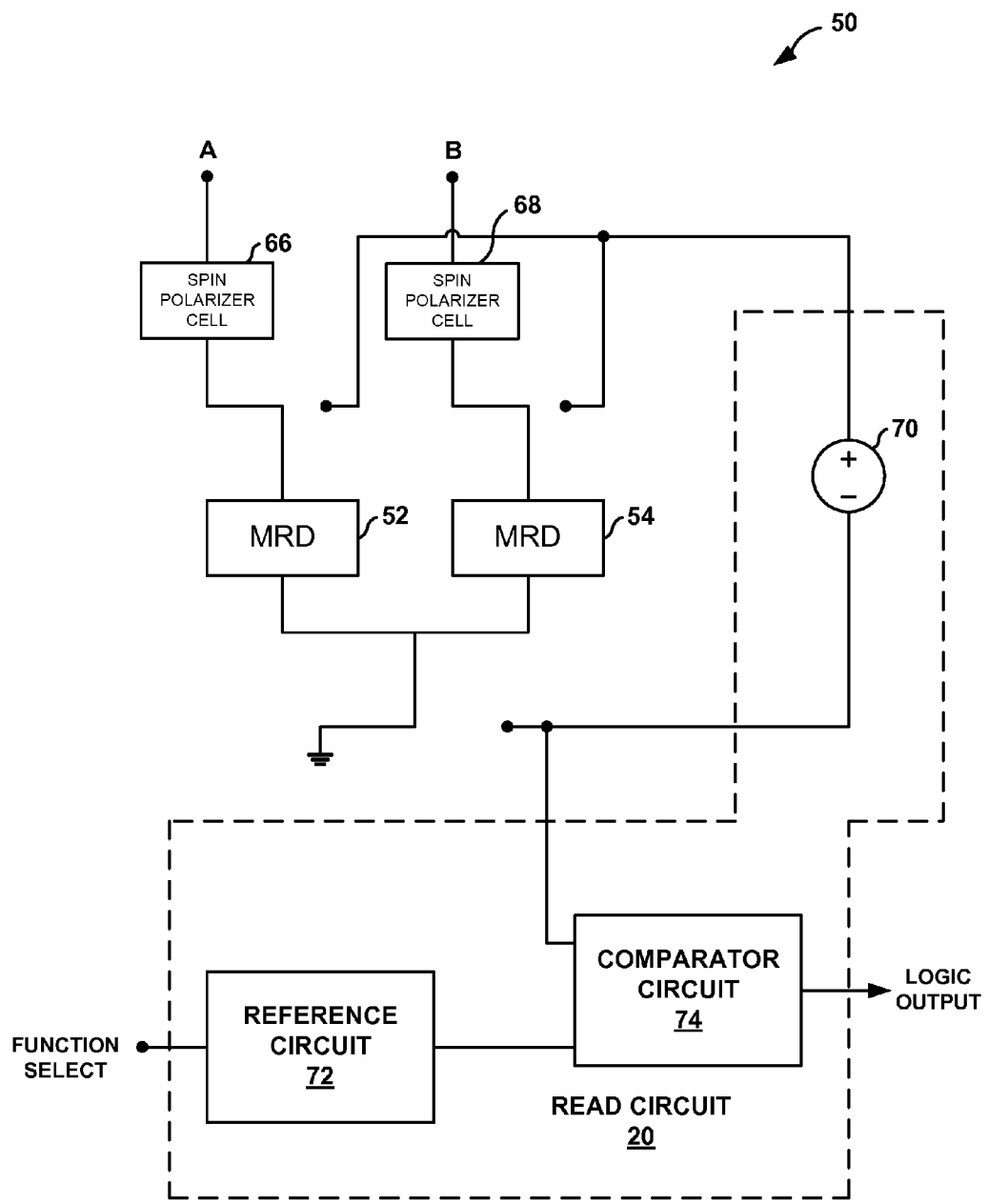
FIG. 5 is a schematic diagram illustrating the magnetic logic device of FIG. 3 configured in a write configuration according to this disclosure.

FIG. 5 is a schematic diagram illustrating the magnetic logic device 50 of FIG. 3 configured in a write configuration according to this disclosure. As shown in FIG. 5, when magnetic logic device 50 is placed in the write configuration, the write circuit is electrically coupled to MRDs 52, 54, and read circuit 20 is decoupled from MRDs 52, 54. More specifically, the spin-polarized currents output terminals of spin-polarizer cells 66, 68 are electrically coupled to first terminals of MRDs 52, 54 respectively, and a ground terminal is electrically coupled to second terminals of MRDs 52, 54. In addition, MRDs 52, 54 may be switched into a write configuration, which may include decoupling MRDs 52, 54 such that the MRDs are not electrically coupled to each other in parallel.

While operating in the write configuration, spin polarizer cell 66 may apply a first spin polarized current to MRD 52 such that a resulting magnetization state of MRD 52 corresponds to a logic input value for a first logic input (i.e., logic input "A"). Similarly, spin polarizer cell 68 may apply a second spin polarized current to MRD 54 such that a resulting magnetization state of MRD 54 corresponds to a logic input value for a first logic input (i.e., logic input "B"). As used herein, a magnetization state of an MRD may correspond to a logic input value when the MRD is placed into one of two magnetization states (e.g., parallel vs. anti-parallel) depending on the value of the logic input (e.g., logic "0" or logic "1"). As one example, the amplitude of the first and second spin polarized currents may be approximately 5 micro-amps (uA), although aspects of this disclosure are not limited to the spin polarized currents being 5 uA.

For example, if a first logic input value is a logic zero, spin polarizer cell 66 may generate a spin-polarized current having a first spin direction (e.g., a spin-down spin direction), which when applied to MRD 52, causes the magnetization state to be programmed to a first magnetization state (e.g., an anti-parallel magnetization state). Similarly, if the logic input value is a logic one, spin polarizer cell 66 may generate a spin-polarized current having a second spin direction (e.g., a spin-up spin direction), which when applied to MRD 52, causes the magnetization state to be programmed to a second magnetization state (e.g., a parallel magnetization state).

Figure 6:
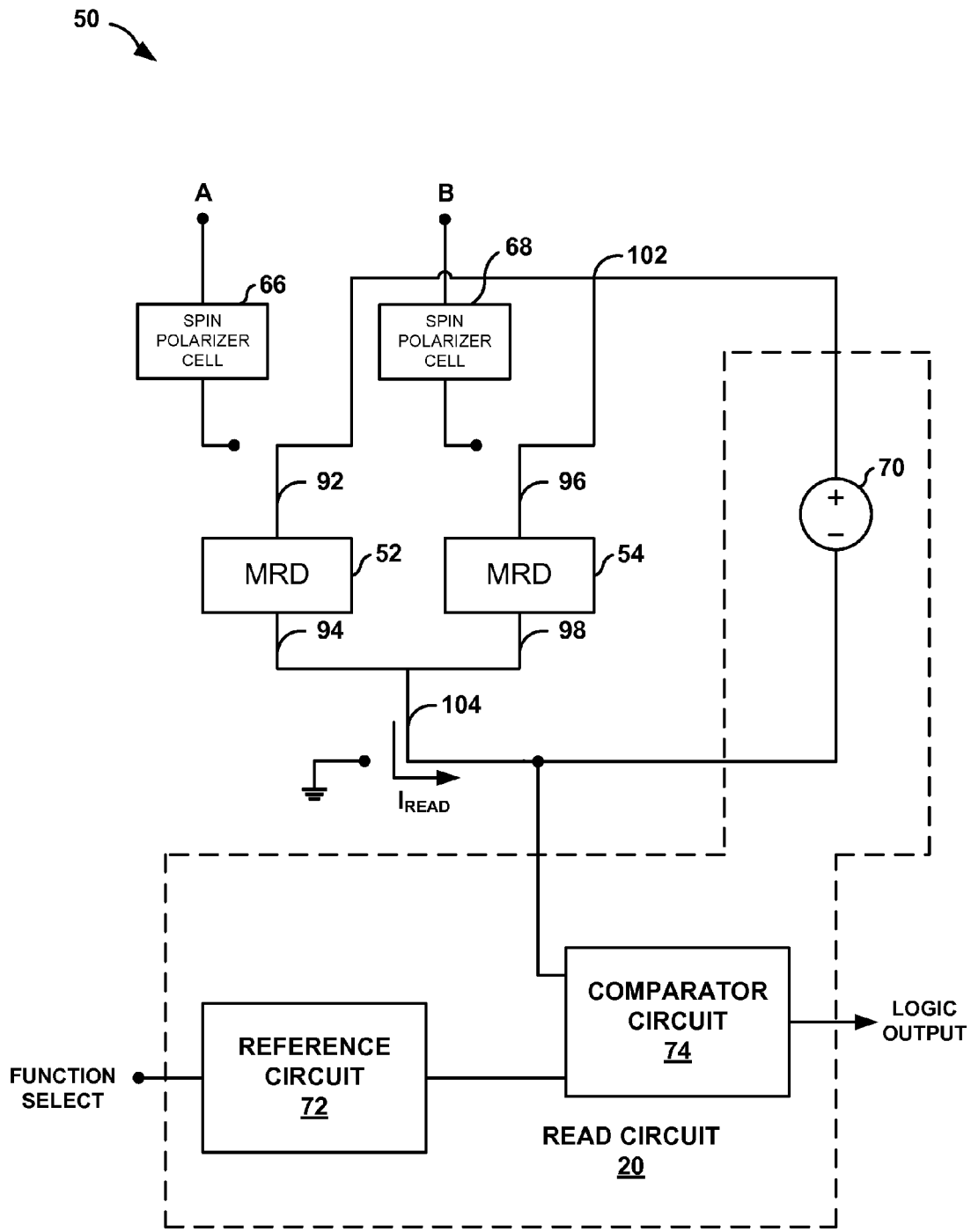
FIG. 6 is a schematic diagram illustrating the magnetic logic device of FIG. 3 configured in a read configuration according to this disclosure.

FIG. 6 is a schematic diagram illustrating the magnetic logic device 50 of FIG. 3 configured in a read configuration according to this disclosure. As shown in FIG. 6, when magnetic logic device is placed in the read configuration, read circuit 20 is electrically coupled to MRDs 52, 54, and the write circuit is decoupled from MRDs 52, 54. More specifically, a first terminal of bias voltage source 70 is electrically coupled to first terminals of MRDs 52, 54 and read circuit 20 is electrically coupled to second terminals of MRDs 52, 54.

In addition, MRDs 52, 54 may be switched into a read configuration, which may include configuring MRDs 52, 54 such that the MRDs are electrically coupled in parallel to form a network of MRDs electrically coupled in parallel. As shown in the example of FIG. 6, the network of MRDs includes two MRDs 52, 54. Terminal 92 of MRD 52 is electrically coupled to terminal 96 of MRD 54, and terminal 94 of MRD 52 is electrically coupled to terminal 98 of MRD 54. A first end terminal 102 for the network of MRDs may be electrically coupled to terminals 92, 96. A second end terminal 104 for the network of MRDs may be electrically coupled to terminals 94, 98. The end terminals of the network may alternatively be referred to as "ends" of the network of MRDs.

While operating in the read configuration, bias voltage source 70 may apply a bias voltage across the network of MRDs 52, 54 electrically coupled in parallel. For example, as shown in FIG. 6, bias voltage source 70 may apply the bias voltage between end terminal 102 and end terminal 104 of the network of MRDs 52, 54 electrically coupled in parallel. As one example, the bias voltage level may be approximately 0.2 V, although aspects of this disclosure are not limited to the bias voltage level being 0.2 V.

In response to the bias voltage being applied across the network of MRDs, a read current ($I_{READ}$) may be induced in the loop formed by bias voltage source 70 and MRDs 52, 54. As shown in FIG. 6, the read current may refer to the current propagating through terminals 102, 104 in the loop as opposed to the branch currents propagating through the individual MRD branches. The amplitude of the read current may correspond to the sum of the amplitudes of both of the branch currents. The amplitude of the read current is dependent on the magnetization states of both of MRDs 52, 54. For example, if both MRDs 52, 54 are in a high resistance state, then the read current may have a relatively low amplitude and be referred to herein as a "low read current." Similarly, if both MRDs 52, 54 are in a low resistance state, then the read current may have a relatively high amplitude and be referred to herein as a "high read current." If one of MRDs 52, 54 is in a low resistance state and the other in a high resistance state, and the other a logic zero, then the read current may have an amplitude between the low read current and high read current amplitudes. Such a current may be referred to herein as an "intermediate read current."

As one example, the impedance of MRDs 52, 54 in the high resistance state may be approximately 80 kΩ, and in the low resistance state may be approximately 40 kΩ. However, it should be noted that aspects of this disclosure are not so limiting. The impedance of the high and low resistance states of MRDs 52, 54 is not limited to 80 kΩ and 40 kΩ, respectively. Also, in some examples, the amplitude of the "low read current" may be approximately 2.5 uA, and the amplitude of the "high read current" may be approximately 3.3 uA. In these examples, the amplitude of the "intermediate read current" may be approximately 2.9 uA. However, the techniques and circuit of this disclosure are not necessarily limited to these read current amplitudes.

As an illustrative example, assume that the high resistance state of MRDs 52, 54 corresponds to MRDs 52 and 54 storing a logic zero, and the low resistance state of MRDs 52, 54 corresponds to MRDs 52, 54 storing a logic one. In this example, if MRDs 52, 54 both store a logic zero, the amplitude of the read current will be the amplitude of the "low read current." If MRDs 52, 54 both store a logic one, the amplitude of the read current will be the amplitude of the "high read current." If MRD 52 stores a logic one, and MRD 54 stores a logic zero, or vice-versa, the amplitude of the read current will be the amplitude of the "intermediate read current," in this example. In this illustrative example, reference circuit 72 may generate a reference current whose amplitude is either greater than the amplitude of the "intermediate read current," and less than the amplitude of the "high read current," or whose amplitude is less than the amplitude of the "intermediate read current," and greater than the amplitude of the "low read current" based on the combinational logic function that is to be performed by magnetic logic gate 50, as indicated by the function select signal.

As a continuation of the above-illustrative example, assume that function select signal indicates that magnetic logic device 50 should operate as an AND gate. Also, assume that comparator circuit 74 outputs a logic zero if the amplitude of the read current is less than the amplitude of the reference current, and outputs a logic one if the amplitude of the read current is greater than the amplitude of the reference current. If the amplitude of the reference current is greater than the amplitude of the intermediate read current, but less than the amplitude of the high read current, magnetic logic device 50 may operate as an AND gate.

For instance, if MRDs 52, 54 each store a logic one, then MRDs 52, 54 are both configured in the low resistance state, which results in the amplitude of the read current being the amplitude of the high read current. In this example, because the amplitude of the reference current is greater than the amplitude of the intermediate read current, but less than the amplitude of the high read current, the output of comparator circuit 74 may be a logic one. Because magnetic logic device 50 may be configured to operate as an AND gate, in this example, the output of comparator circuit 74 should be a logic one when both the input values are logic ones. Accordingly, in this configuration, the output of comparator circuit 74 is a logic one when the input values, stored on MRDs 52, 54, are both a logic one.

When magnetic logic device 50 is configured as an AND gate, if MRDs 52, 54 each store a logic zero, then MRDs 52, 54 are both configured in the high resistance state, which results in the amplitude of the read current being the amplitude of the low read current. In this example, because the amplitude of the reference current is greater than the amplitude of the intermediate read current, the output of comparator circuit 74 may be a logic zero. Again, the amplitude of the intermediate read current is greater than the amplitude of the low read current, accordingly, if the amplitude of the reference current is greater than the amplitude of the intermediate read current, then the amplitude of the reference current is greater than the amplitude of the low read current. Because magnetic logic device 50 may be configured to operate as an AND gate, in this example, the output of comparator circuit 74 should be a logic zero when both the input values are logic zeros. Accordingly, in this configuration, the output of comparator circuit 74 is a logic zero when the input values, stored on MRDs 52, 54, are both a logic zero.

When magnetic logic device 50 is configured as an AND gate, if MRD 52 stores a logic one, and MRD 54 stores a logic zero, or vice-versa, then MRD 52 is configured in the low resistance state, and MRD 54 is configured in the high resistance state, which results in the amplitude of the read current being the amplitude of the intermediate read current. In this example, because the amplitude of the reference current is greater than the amplitude of the intermediate read current, the output of comparator circuit 74 may be a logic zero. Because magnetic logic device 50 may be configured to operate as an AND gate, in this example, the output of comparator circuit 74 should be a logic zero when one input value is a logic one and the other is a logic zero. Accordingly, in this configuration, the output of comparator circuit 74 is a logic zero when the input values, stored in MRDs 52, 54, are a logic one and a logic zero, respectively.

The above example described on technique with which to configure magnetic logic device 50 as an AND gate. As another example, aspects of this disclosure may be directed to configuring magnetic logic device 50 as an OR gate.

For example, assume that function select signal indicates that magnetic logic device 50 should operate as an OR gate. Also, similar to the above example of the AND gate, assume that comparator circuit 74 outputs a logic zero if the amplitude of the read current is less than the amplitude of the reference current, and outputs a logic one if the amplitude of the read current is greater than the amplitude of the reference current. If the amplitude of the reference current is less than the amplitude of the intermediate read current, but greater than the amplitude of the high read current, magnetic logic device 50 may operate as an OR gate.

For instance, if MRDs 52, 54 each store a logic one, then MRDs 52, 54 are both configured in the low resistance state, which results in the amplitude of the read current being the amplitude of the high read current. In this example, because the amplitude of the reference current is less than the amplitude of the intermediate read current, but greater than the amplitude of the low read current, the output of comparator circuit 74 may be a logic one. Again, the amplitude of the high read current is greater than the amplitude of the intermediate read current. Accordingly, if the amplitude of the reference current is less than the amplitude of the intermediate read current, then the amplitude of the reference current is less than the amplitude of the high read current. Because magnetic logic device 50 may be configured to operate as an OR gate, in this example, the output of comparator circuit 74 should be a logic one when both the input values are logic ones. Accordingly, in this configuration, the output of comparator circuit 74 is a logic one when the input values, stored on MRDs 52, 54, are both a logic one.

When magnetic logic device 50 is configured as an OR gate, if MRDs 52, 54 each store a logic zero, then MRDs 52, 54 are both configured in the high resistance state, which results in the amplitude of the read current being the amplitude of the low read current. In this example, because the amplitude of the reference current is less than the amplitude of the intermediate read current, the output of comparator circuit 74 may be a logic zero. Because magnetic logic device 50 may be configured to operate as an OR gate, in this example, the output of comparator circuit 74 should be a logic zero when both the input values are logic zeros. Accordingly, in this configuration, the output of comparator circuit 74 is a logic zero when the input values, stored on MRDs 52, 54, are both a logic zero.

When magnetic logic device 50 is configured as an OR gate, if MRD 52 stores a logic one, and MRD 54 stores a logic zero, or vice-versa, then MRD 52 is configured in the low resistance state, and MRD 54 is configured in the high resistance state, which results in the amplitude of the read current being the amplitude of the intermediate read current. In this example, because the amplitude of the reference current is less than the amplitude of the intermediate read current, the output of comparator circuit 74 may be a logic one. Because magnetic logic device 50 may be configured to operate as an OR gate, in this example, the output of comparator circuit 74 should be a logic one when one input value is a logic one and the other is a logic zero. Accordingly, in this configuration, the output of comparator circuit 74 is a logic one when the input values, stored in MRDs 52, 54, are a logic one and a logic zero, respectively.

In general, the amplitude of the reference current may be between the low read current amplitude and the intermediate read current amplitude to implement an OR gate. The amplitude of the reference current may be between the intermediate read current amplitude and the high read current amplitude to implement an AND gate. In further examples, the amplitude of the reference current may be similarly selected to implement an XOR gate, and XNOR gate or a VOTING-OR gate. These techniques may also be used to implement NAND and NOR gates. In this manner, the two-input magnetic logic device 50 may be used to implement multiple types of combinational logic functions.

It should be understood that the above examples are provided for purposes of illustration and should not be considered as limiting. For example, in the above example, a high resistance state corresponded to MRDs 52, 54 storing a logic zero, and a low resistance state corresponded to MRDs 52, 54 storing a logic one. In alternate examples, MRDs 52, 54 may be configured to a high resistance state to store a logic one, and a low resistance state to store a logic zero. In these alternate examples, the amplitude of the reference current should be selected appropriately. For instance, in these alternate examples, the amplitude of the reference current may be between the low read current amplitude and the intermediate read current amplitude to implement an AND gate, and may be between the intermediate read current amplitude and the high read current amplitude to implement an OR gate.

As another example, in the above examples, comparator circuit 74 outputted a logic one if the amplitude of the read current is greater than the amplitude of the reference current, and outputted a logic zero if the amplitude of the read current is less than the amplitude of the reference current. However, aspects of this disclosure are not so limited. In alternate examples, comparator circuit 74 may output a logic one if the amplitude of the read current is less than the amplitude of the reference current, and output a logic zero if the amplitude of the read current is greater than the amplitude of the reference current. In these alternate examples, the amplitude of the reference current should be selected appropriately to cause magnetic logic device 50 to operate in accordance with the combinational logic function indicated by the function select signal.

Figure 7A:
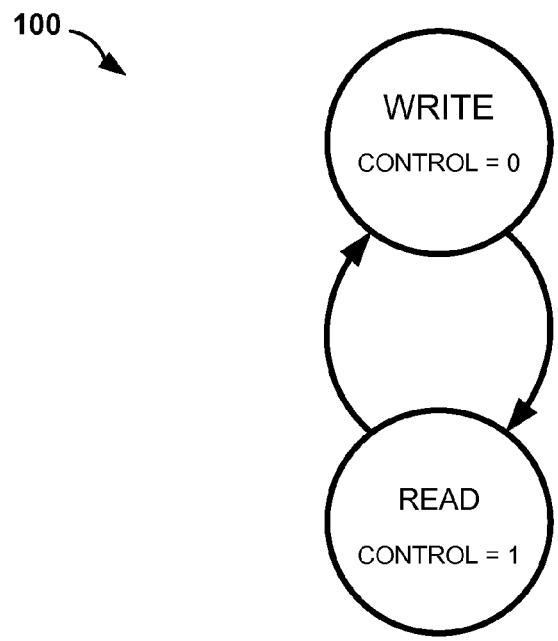
FIG. 7A is a state transition diagram illustrating an example implementation of a control unit for use in the magnetic logic devices of FIGS. 1 and 3 according to this disclosure.

FIG. 7A is a state transition diagram 100 illustrating an example implementation of a control unit for use in the magnetic logic devices 10 and 50 of FIGS. 1 and 3 according to this disclosure. For purposes of explanation, state transition diagram 100 will be described with respect to control unit 56 of FIG. 3.

State transition diagram 100 includes a Write state and a Read state. Control unit 56 may initialize into the Write state. During the Write state, control unit 56 generates a logic zero control signal, which may be used to control switching modules 58, 60, 62 to switch magnetic logic gate 50 into a write configuration (e.g., couple the T1 terminals to respective P terminals). In some examples, when operating in the Write State, control unit 56 may automatically select the Read state as the next state. In other words, the selection of the Read state as the next state may be independent of any external input received by control unit 56.

Control unit 56 may receive a timing signal that causes control unit 56 to initiate the transition from the Write state to the Read state. In some examples, the timing signal may be a clock signal, and control unit 56 may transition to the next state when control unit 56 when a particular signal condition occurs in the clock signal (e.g., a positive transition, negative transition, positive level, negative level, etc.). In additional examples, the timing signal may not be a clock signal, but may be a timing signal that is activated by an external device. In any case, the timing signal may be used by control unit 56 to determine when to transition from the Write state to the Read state, but not necessarily used to determine to which particular state to transition.

During the Read state, control unit 56 generates a logic one control signal, which may be used to control switching modules 58, 60, 62 to configure magnetic logic device 50 into a read configuration (e.g., couple the T2 terminals to the respective P terminals). In some examples, when operating in the Read State, control unit 56 may automatically select the Write state as the next state. In other words, the selection of the Write state as the next state may be independent of any external input received by control unit 56. The timing signal may again be used to cause control unit 56 to initiate the transition from the Read state to the Write state.

As shown in FIG. 7A, control unit 56 may successively switch between the Write state and the Read state to continuously perform logic operations. The performance of a single logic operation may include the traversal of both the Write state and the Read state in automatic succession, i.e., switching magnetic logic device 50 into a write configuration and switching MRD 12 into a read configuration in response to switching magnetic logic device 50 into a write configuration.

Figure 7B:
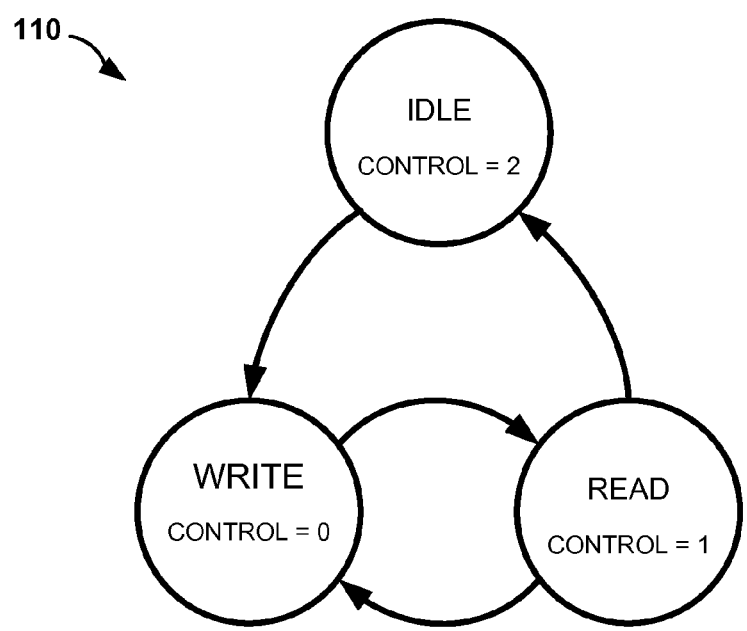
FIG. 7B is a state transition diagram illustrating another example implementation of a control unit for use in the magnetic logic devices of FIGS. 1 and 3 according to this disclosure.

FIG. 7B is a state transition diagram 110 illustrating another example implementation of a control unit for use in the magnetic logic devices 10 and 50 of FIGS. 1 and 3 according to this disclosure. For purposes of explanation, state transition diagram 110 will be described with respect to control unit 56 of FIG. 3.

State transition diagram 110 is similar to state transition diagram 100 of FIG. 7A except that state transition diagram 110 includes a third Idle state. The Idle state may correspond to a power-down state and/or a standby state. During operation, control unit 56 may initialize to the Idle state. While operating in the Idle state, control unit 56 may generate a control signal having a value of two (e.g., logic "10").

In some examples, while operating in the Idle state, control unit 56 may cause the write circuit and the read circuit in the magnetic logic device to power-down. In additional examples, the magnetic logic device may include "on-off-on" SPDT switching modules 58, 60, 62. In such examples, while operating in the Idle state, control unit 56 may cause the "on-off-on" switching modules 58, 60, 62 to switch to an off state where magnetic logic device 50 is neither in a write configuration nor a read configuration, i.e., neither a write circuit nor a read circuit is electrically coupled to MRDs 52, 54.

Control unit 56 may receive both a timing signal and an idle signal. The idle signal may indicate whether magnetic logic device 50 should be performing a logic operation or idling. Control unit 56 may remain in the Idle state when the idle signal indicates that magnetic logic device 50 should be idling. When the idle signal indicates that magnetic logic device 50 should be performing a logic operation, then control unit 56 may transition to the Write state.

After transitioning to the Write state, control unit 56 may perform logic operations by successively switching between the Write state and the Read state as long as the idle signal indicates that magnetic logic device 50 should be performing logic operations. When the Idle signal indicates that magnetic logic device 50 should be idling, control unit 56 may transition from the Read state back to the Idle state.

Figure 8:
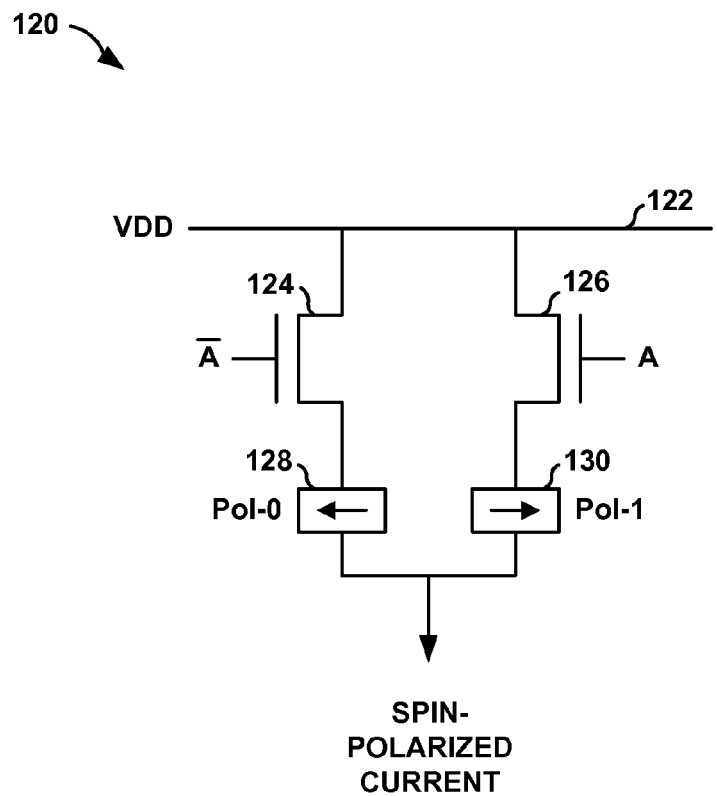
FIG. 8 is a schematic illustrating an example spin polarizer cell for use within the magnetic logic device of FIG. 3 according to this disclosure.

FIG. 8 is a schematic illustrating an example spin polarizer cell 120 for use within the magnetic logic devices of FIGS. 1 and 3. Spin polarizer cell 120 is configured to receive a logic input value for a combinational logic function, and to generate a spin-polarized current having a spin direction that corresponds to the logic input value of the combinational logic function. Spin polarizer cell 120 includes a voltage supply line 122, transistors 124, 126, and spin filters 128, 130.

Transistor 124 includes a source terminal electrically coupled to supply line 122, a drain terminal electrically coupled to spin filter 128, and a gate terminal electrically coupled to a complemented version of the logic input signal (i.e., A). Transistor 126 includes a source terminal electrically coupled to supply line 122, a drain terminal electrically coupled to spin filter 130, and a gate terminal electrically coupled to an un-complemented version of logic input signal (i.e., A).

Spin filters 128, 130 are configured to receive a current from transistors 124, 126 and to generate a spin-polarized current. The spin direction of the spin-polarized current is determined by the type of spin filter. For example, spin filter 128 is a spin-down type spin filter configured to generate a spin-polarized current having a spin-down spin direction. Similarly, spin filter 130 is a spin-up type spin filter configured to generate a spin-polarized current having a spin-up spin direction.

Spin filter 128 includes an input terminal electrically coupled to the drain of transistor 124, and an output terminal electrically coupled to the spin-polarized current output terminal of spin polarizer cell 120. Spin filter 130 includes an input terminal electrically coupled to the drain of transistor 126, and an output terminal electrically coupled to the spin-polarized current output terminal of spin polarizer cell 120.

Spin filters 128, 130 may include a ferromagnetic material configured to polarize the spin direction (e.g., angular momentum) of the electrons passing through the ferromagnetic material into one of two spin directions (i.e., spin-up or spin-down). Ferromagnetic materials used to implement spin filters 128, 130 may include iron, nickel, cobalt, binary or ternary alloys of the preceding metals, or the like. As shown in FIG. 8, spin filter 128 is configured to polarize the electrons into a spin-down spin direction indicated by the left-hand arrow, and spin filter 130 is configured to polarize the electrons into a spin-up pattern as indicated by the right hand arrow.

During operation, spin polarizer cell 120 receives a logic input value, and in some examples, the complement of the logic input value. If the complement of the logic input value is not received, then spin polarizer cell 120 may generate the complemented version of the logic input value.

If the logic input value is a logic zero, then transistor 124 supplies a current to spin filter 128 and transistor 126 does not supply current (or a negligible amount of current) to spin filter 130. Spin filter 128 polarizes the current to generate a spin-polarized current with a spin-down spin direction (i.e., Pol-0).

Similarly, if the logic input value is a logic one, then transistor 124 does not supply current (or a negligible amount of current) to spin filter 128 and transistor 126 supplies a current to spin filter 128 to spin filter 130. Spin filter 130 polarizes the current to generate a spin-polarized current with a spin-up spin direction (i.e., Pol-1).

Figure 9:
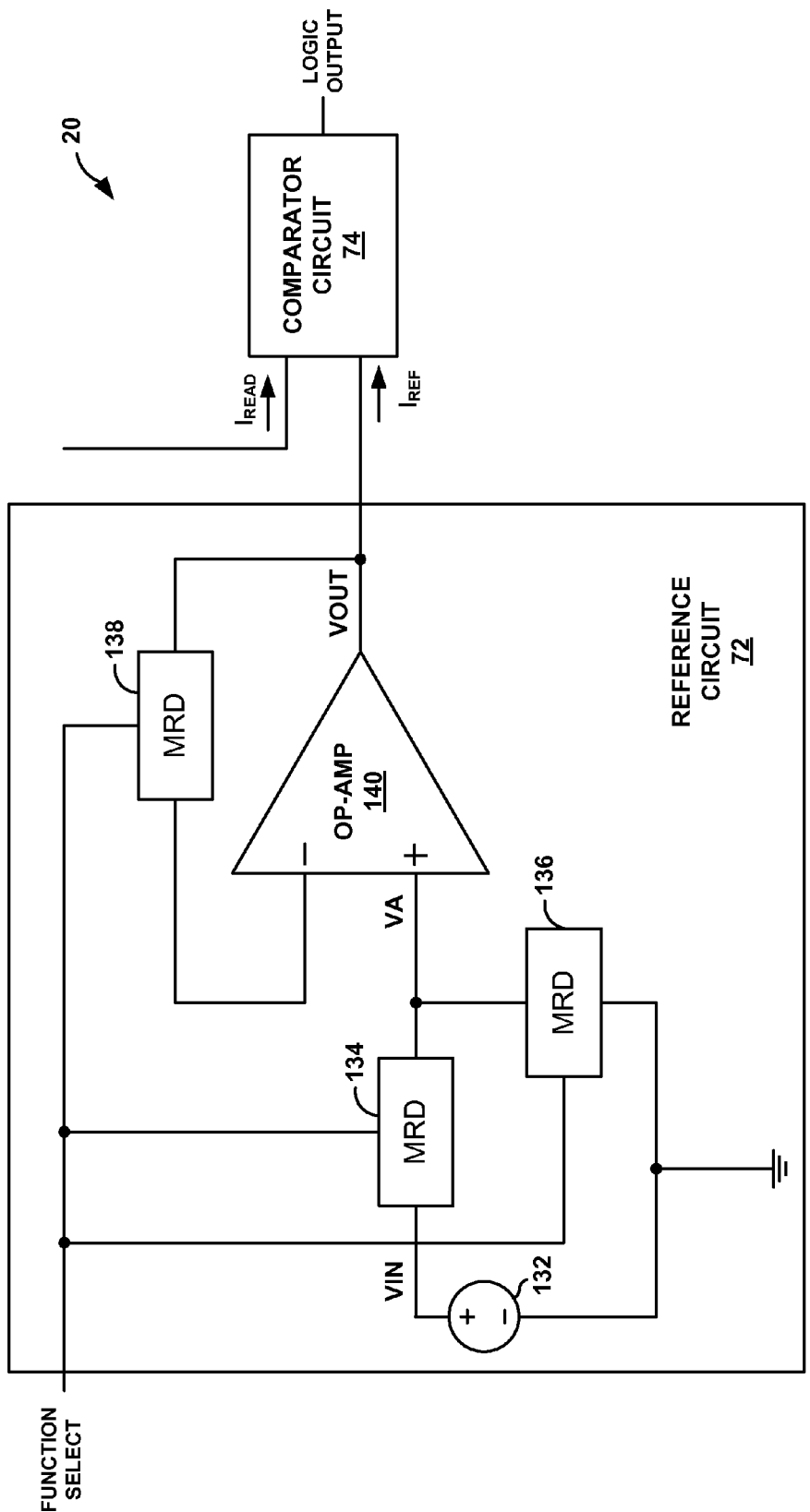
FIG. 9 is a schematic illustrating an example reference circuit and comparator circuit of a read circuit for use within the magnetic logic device of FIG. 3 according to this disclosure.

FIG. 9 is a schematic illustrating an example reference circuit 72 and comparator circuit 74, of read circuit 20, for use within the magnetic logic device of FIG. 3. As illustrated in FIG. 9, reference circuit 72 may include a voltage source 132, MRDs 134, 136, and 138, and operational amplifier (op-amp) 140. The output of op-amp 140 may be the reference current ($I_{REF}$) generated by reference circuit 72, which may be a configurable reference circuit.

Reference circuit 72 may also include bias voltage source 70, e.g., as illustrated in FIGS. 3, 5, and 6. For purposes of clarity, bias voltage source 70 is not illustrated in FIG. 9. Moreover, the example of reference circuit 72 is provided for purposes of illustration and should not be considered limiting. In general, reference circuit 72 may include one or more MRDs, such as MRDs 134, 136, and 138, to generate a reference current at the desired amplitude.

Voltage source 132 may generate a voltage VIN. In some examples, the amplitude of VIN may be fixed. In some alternate example, the amplitude of VIN may be set during use based on the function select signal received by reference circuit 72.

Voltage source 132 may generate a voltage (VA) at the positive input of op-amp 140. Voltage VA may be defined by the impedance provided by MRD 134 and MRD 136. For example, voltage VA may equal approximately (R2/(R1+R2))*VIN, where R1 refers to the amount of impedance provided by MRD 134, and R2 refers to the amount of impedance provided by MRD 136.

For instance, if the impedance provided by MRD 136 is half the impedance provided by MRD 134, then voltage VA may be approximately one-third VIN. If the impedance provided by MRD 136 equals the impedance provided by MRD 134, then voltage VA may be approximately one-half VIN. If the impedance provided by MRD 136 is twice the impedance provided by MRD 134, then voltage VA may approximately two-thirds VIN.

Voltage VA, at the positive input of op-amp 140, may cause op-amp 140 to output a voltage (VOUT) and the reference current ($I_{REF}$). The amplitude of the reference current may be approximately (VOUT−VA)/R3, where R3 refers to the amount of impedance provided by MRD 138, and MRD 138 is coupled to the output of op-amp 140 and the negative input of op-amp 140. Accordingly, as can be seen from the above equations, the amplitude of the reference current is based upon the amount of impedance provided by MRDs 134, 136, and 138.

MRDs 134, 136, and 138 may be distinct from MRDs 52 and 54 (FIGS. 3, 5, and 6). For example, as described above MRDs 52 and 54 may store input logic values. MRDs 134, 136, and 138 may be utilized to generate the reference current at the desired amplitude. Similarly, voltage source 132 may be distinct from bias voltage source 70. However, aspects of this disclosure are not so limited. In some examples, bias voltage source 70 and voltage source 132 may be formed as the same voltage source.

Examples of MRDs 134, 136, and 138 include, but are not limited to, giant magnetoresistance (GMR) devices, magnetic tunnel junction (MTJ) devices, tunneling magnetoresistance (TMR) devices, current perpendicular-to-plane (CCP) magnetoresistance devices, and current in-to-place (CIP) magnetoresistance devices. MRDs 134, 136, and 138 may be magnetoresistance devices with spin transfer (ST/STT). MRDs 134, 136, and 138 may also be magnetoresistance devices with inductive wiring including toggle wiring.

The amount of impedance provided by MRDs 134, 136, and 138 may be based on the function select signal, which may be set at the time of manufacture, or may be set during use. For instance, reference circuit 72 may receive the function select signal which indicates whether magnetic logic device 50 should function as an AND gate or as an OR gate. As one example, if the function select signal indicates that magnetic logic device 50 should function as an AND gate, the function select signal may configure MRDs 134, 136, and 138 to provide impedance that causes the amplitude of the reference current to be greater than the amplitude of the intermediate read current, and less than the amplitude of the high read current, as described above. As another example, if the function select signal indicates that magnetic logic device 50 should function as an OR gate, the function select signal may configure MRDs 134, 136, and 138 to provide impedance that causes the amplitude of the reference current to be less than the amplitude of the intermediate read current, but greater than the amplitude of the low read current, as described above.

There may be many techniques with which the function select signal may configure MRDs 134, 136, and 138 to provide the appropriate amount of impedance. For example, a processor, external to magnetic logic device 50, may generate the function select signal to cause magnetic logic device 50 to implement the desired combinational logic function, e.g., operate as an AND gate or as an OR gate. In some examples, the processor may utilize a look-up table, address control, and/or some other combinational logic to determine whether magnetic logic device 50 should operate as an AND gate or as an OR gate. The processor may then output the function select signal. The function select signal may then configure MRDs 134, 136, and 138 to provide the appropriate amount of impedance.

It should be understood that the example above is provided for illustration purposes, and should not be considered as limiting. In general, any technique may be utilized to generate the function select signal. Moreover, the function select signal may be set during manufacture, or programmable during use. Similarly, the amount of impedance provided by MRDs 134, 136, and 138 may be set during manufacture, or programmable during use. In this manner, reference circuit 72 may be a configurable reference circuit.

As described above, comparator circuit 74 may receive the reference current and the read current, and may output the logic output based on the comparison. To perform such comparisons, comparator circuit 74 may include one or more units. For example, comparator circuit 74 may include an amplifier to proportionally increase the amplitudes of the read current and the reference current to ease the comparison. Also, comparator circuit 74 may include two transimpedance amplifiers that covert the amplitudes of the read current and reference current into voltages. Comparison of voltage amplitudes may be easier than the comparison of current amplitudes. However, comparator circuit 74 need not necessarily includes these units. In general, comparator circuit 74 may utilize any technique to compare the amplitudes of the read current and the reference current.

Figure 10:
FIG. 10 is a truth table illustrating example functionality for the magnetic logic device of FIG. 3 according to this disclosure.

FIG. 10 is a truth table 160 illustrating example functionality for the magnetic logic device 50 of FIG. 3. The "A:Input" column represents a binary logic input value received by spin polarizer cell 66. The "B:Input" column represents a binary logic input value received by spin polarizer cell 68. The "A:Write" column represents the spin-polarization direction for the spin-polarized current generated by spin-polarizer cell 66. The "B:Write" column represents the spin-polarization direction for the spin-polarized current generated by spin-polarizer cell 68. The "A:Res" column represents the resistance state (i.e., magnetization state) of MRD 52. The "B:Res" column represents the resistance state (i.e., magnetization state) of MRD 54. The "$I_{Read}$" column represents the relative read current amplitude propagating through MRDs 52, 54 in response to a voltage applied by bias voltage source 70.

The "AND Function" column represents a binary logic output value generated by comparator circuit 74 when magnetic logic gate 50 is configured to apply an AND function to the logic inputs. In such examples, if the amplitude of the reference current is greater than the amplitude of the intermediate read current, comparator circuit 74 may output a logic zero when the A:Input and B:Input are each a logic zero, or when one is a logic one, and the other is a logic zero. In such examples, comparator circuit 74 may output a logic one when the A:Input and B:Input are each a logic one.

The "OR Function" column represents a binary logic output value generated by comparator circuit 74 when magnetic logic gate 50 is configured to apply an OR function to the logic inputs. In such examples, if the amplitude of the reference current is less than the amplitude of the intermediate read current, comparator circuit 74 may output a logic zero when the A:Input and B:Input are each a logic zero. In such examples, comparator circuit 74 may output a logic one when the A:Input and B:Input are each a logic one, or when one is a logic one, and the other a logic zero.

As shown in FIG. 10, magnetic logic gate 50 may act as either an AND gate or an OR gate depending on the amplitude of the reference current. As described above, the amplitude of the reference current may be dynamically adjusted based on the function select signal. Additional mappings may be used to implement an XOR gate, an XNOR gate, and a VOTING-OR gate.

Figure 11:
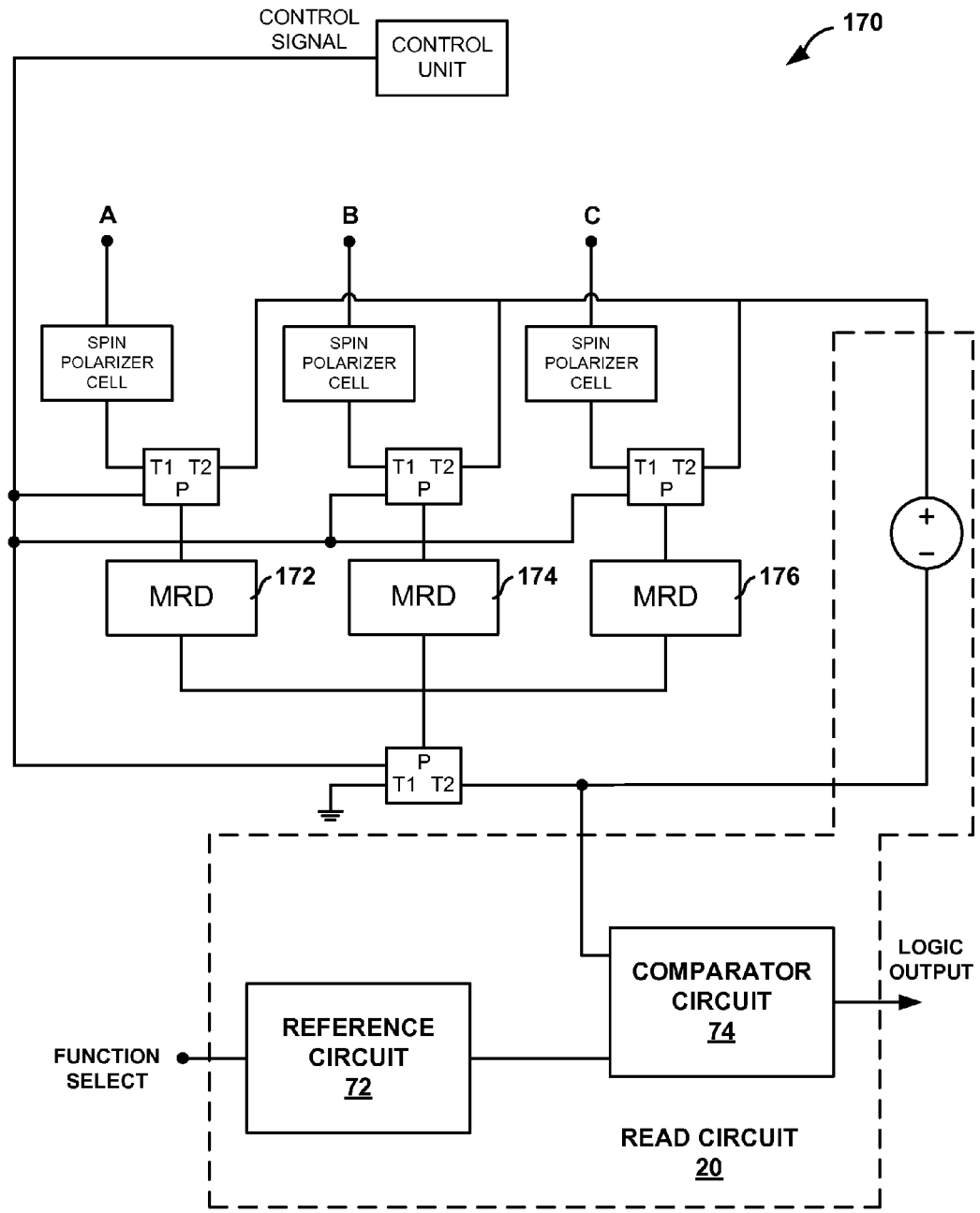
FIG. 11 is a schematic illustrating an example three-input magnetic logic device according to this disclosure.

FIG. 11 is a schematic illustrating an example three-input magnetic logic device 170 according to this disclosure. Magnetic logic device 170 is similar to magnetic logic device 50 shown in FIG. 3 except that magnetic logic device 170 is configured to operate on three logic input values. Thus, magnetic logic device 170 includes three MRDs 172, 174, 176 configured in the manner shown in FIG. 11. Magnetic logic device 170 also includes an additional spin polarizer cell and an additional switching module. The components used to implement magnetic logic device 170 are substantially similar to the components used to implement magnetic logic device 50 shown in FIG. 3. Thus, similarly named components will not be described in the interest of brevity and to avoid redundancy. Moreover, the operation of magnetic logic device 170 is similar to the operation of magnetic device 50 shown in FIG. 3.

Figure 12:
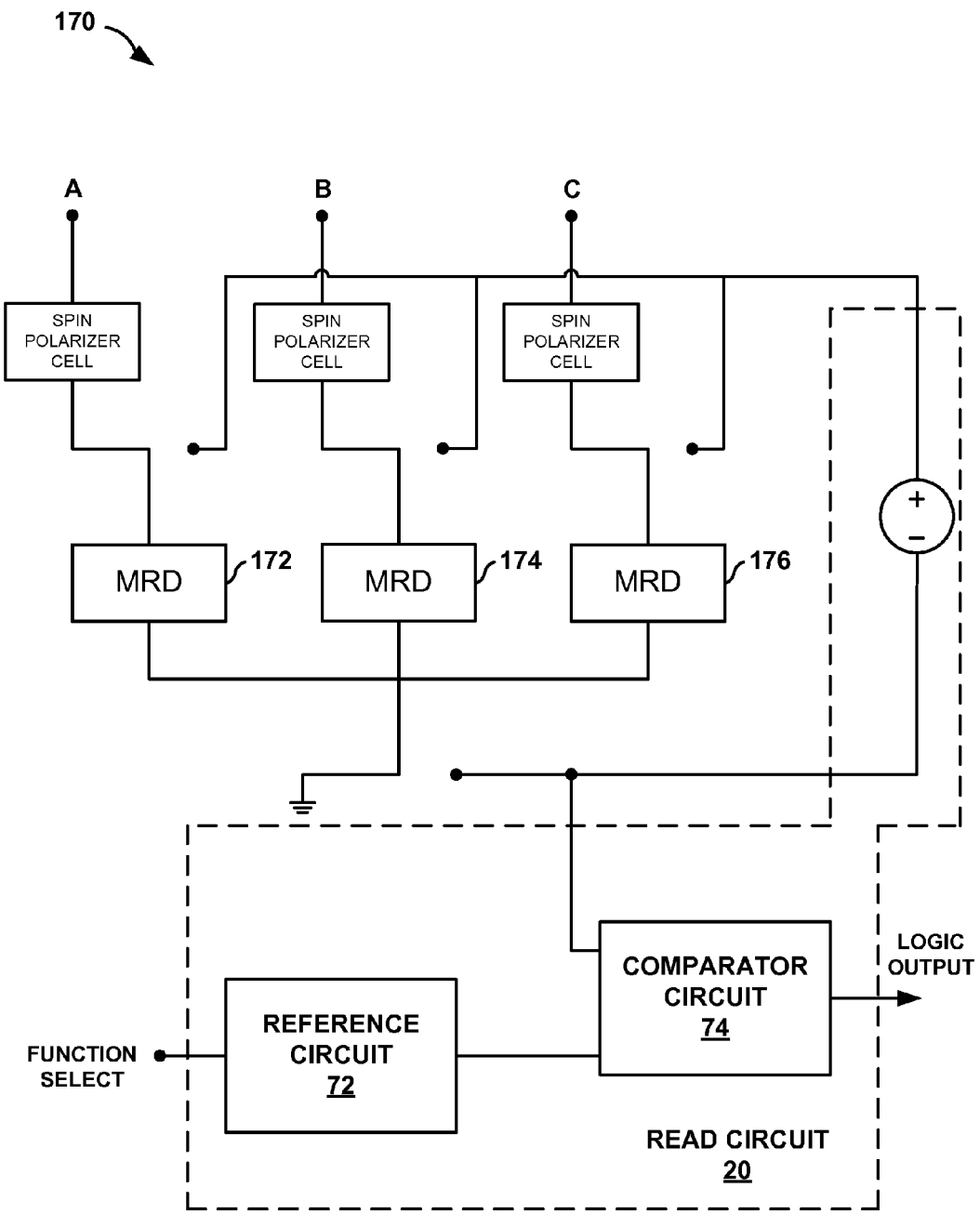
FIG. 12 is a schematic diagram illustrating the magnetic logic device of FIG. 11 configured in a write configuration according to this disclosure.
Figure 13:
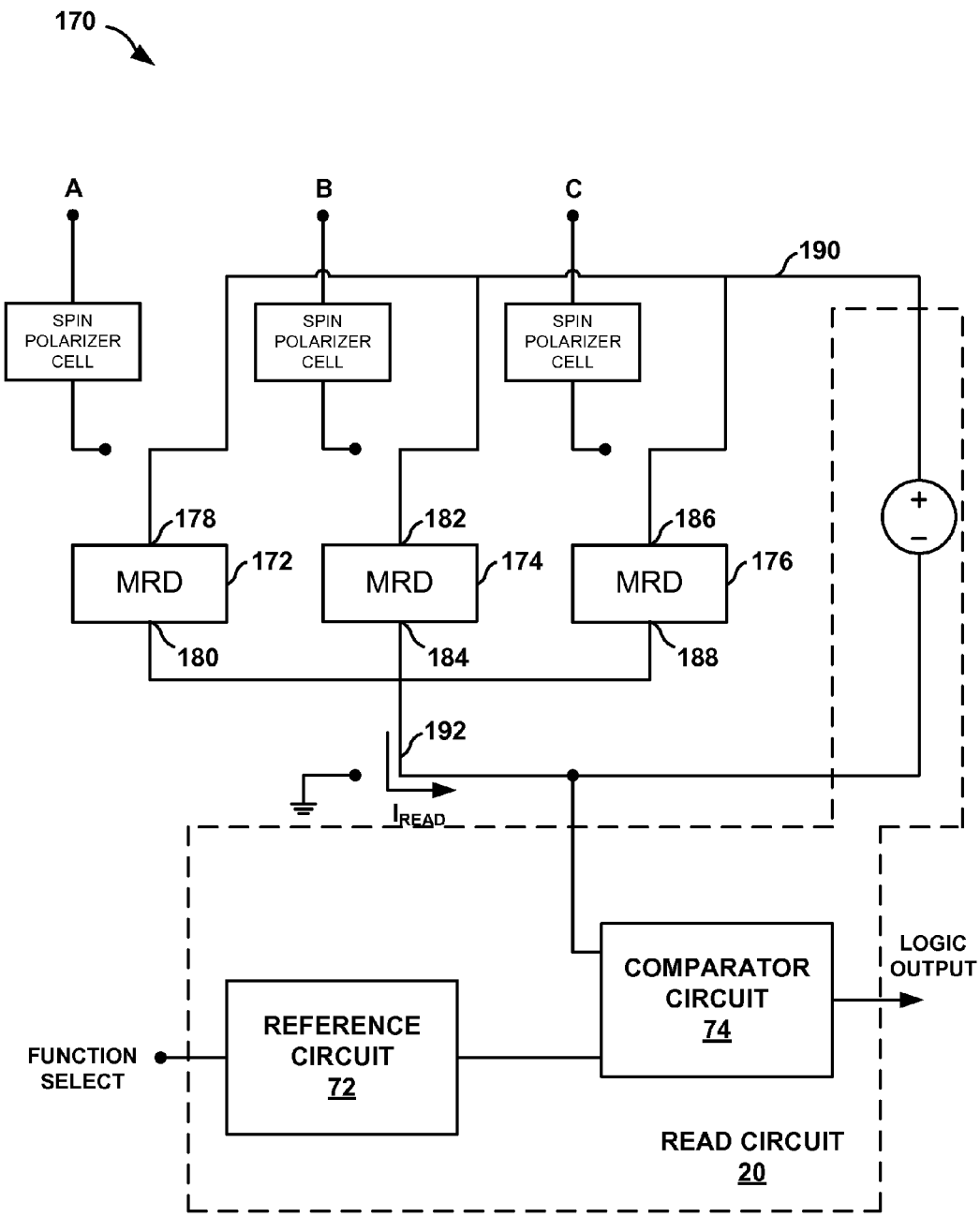
FIG. 13 is a schematic diagram illustrating the magnetic logic device of FIG. 11 configured in a read configuration according to this disclosure.

FIG. 12 is a schematic diagram illustrating the magnetic logic device of FIG. 11 configured in a write configuration according to this disclosure. FIG. 13 is a schematic diagram illustrating the magnetic logic device of FIG. 11 configured in a read configuration according to this disclosure. FIG. 13 illustrates a network of three MRDs 172, 174, 176 electrically coupled in parallel. Terminals 178, 182 and 186 of MRDs 172, 174 and 176 are electrically coupled to each other and to end terminal 190. Terminals 180, 184, 188 of MRDs 172, 174 and 176 are electrically coupled to each other and to end terminal 192.

Figure 14:
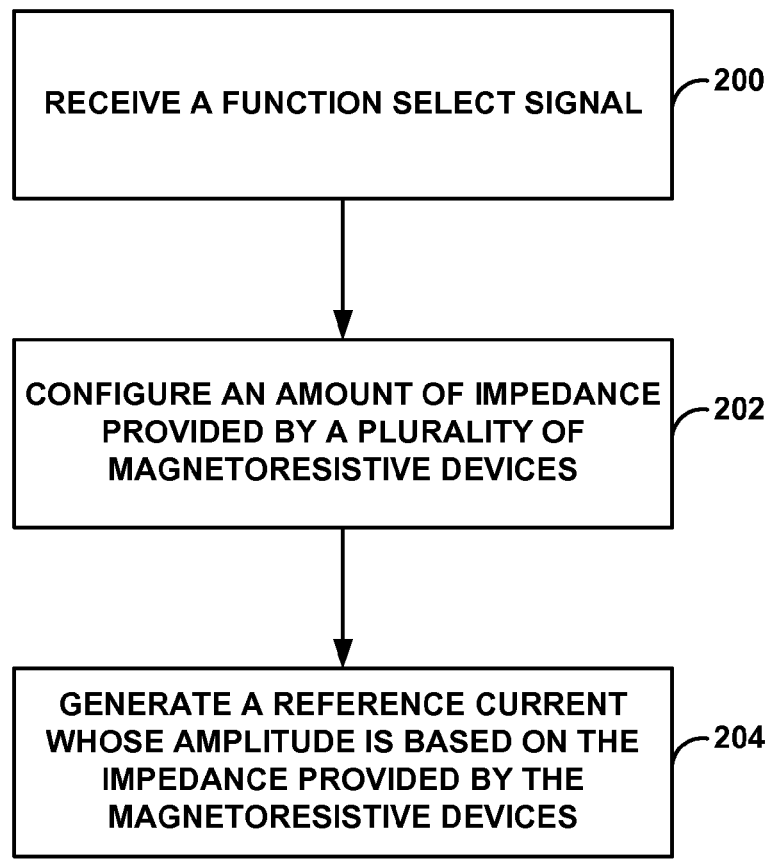
FIG. 14 is a flowchart illustrating an example technique for generating a reference current according to this disclosure.

FIG. 14 is a flowchart illustrating an example technique for generating a reference current according to this disclosure. For purposes of illustration only, reference is made to FIGS. 6, 9, and 13.

A magnetic logic device, such as magnetic logic device 10 or 50, may receive a function select signal that indicates a combinational logic function that is to be performed by the magnetic logic device on input values stored on the magnetic logic device (200). For example, magnetic logic device 10 or 50 may receive a function select signal that indicates that magnetic logic device 10 or 50 should perform an AND, OR, NOR, NAND, or voting-OR logic function. In some examples, the combinational logic function may be performed on the input values stored in MRDs 52 and 54, or MRDs 172, 174, and 176.

In some examples, the function select signal may configure an amount of impedance provided by each one of the plurality of magnetoresistive devices of a reference circuit based on the combinational logic function that is to be performed by the magnetic logic device (202). For example, the function select signal may configure the amount of impedance provided by MRDs 134, 136, and 138 of reference circuit 72. As one example, the amount of impedance provided by MRDs 134, 136, and 138 of reference circuit 72 may be different if the combinational logic function is an AND logic function compared to if the combinational logic function is an OR logic function. In other words, the function select signal indicates the combinational logic function which is to be performed by the magnetic logic gate. Furthermore, because the function select signal indicates the combinational logic function, the function select signal may cause MRDs 134, 136, and 138 to be configured to provide the impedance that causes the generated reference current to be at the appropriate amplitude for the function indicated by the function select signal.

Reference circuit 72 may generate a reference current ($I_{REF}$) whose amplitude is based at least on the amount of impedance provided by each of the plurality of magnetoresistive devices (204). For example, as illustrated in FIG. 9, op-amp 140 may output a voltage (VOUT). The amplitude of the reference current may be approximately VOUT minus the voltage at the positive node of op-amp 140 (VA) divided by the amount of impedance provided by MRD 138. The voltage VA may be based on the impedance provided by MRDs 134 and 136 and the voltage provided by voltage source 132 (VIN).

Figure 15:
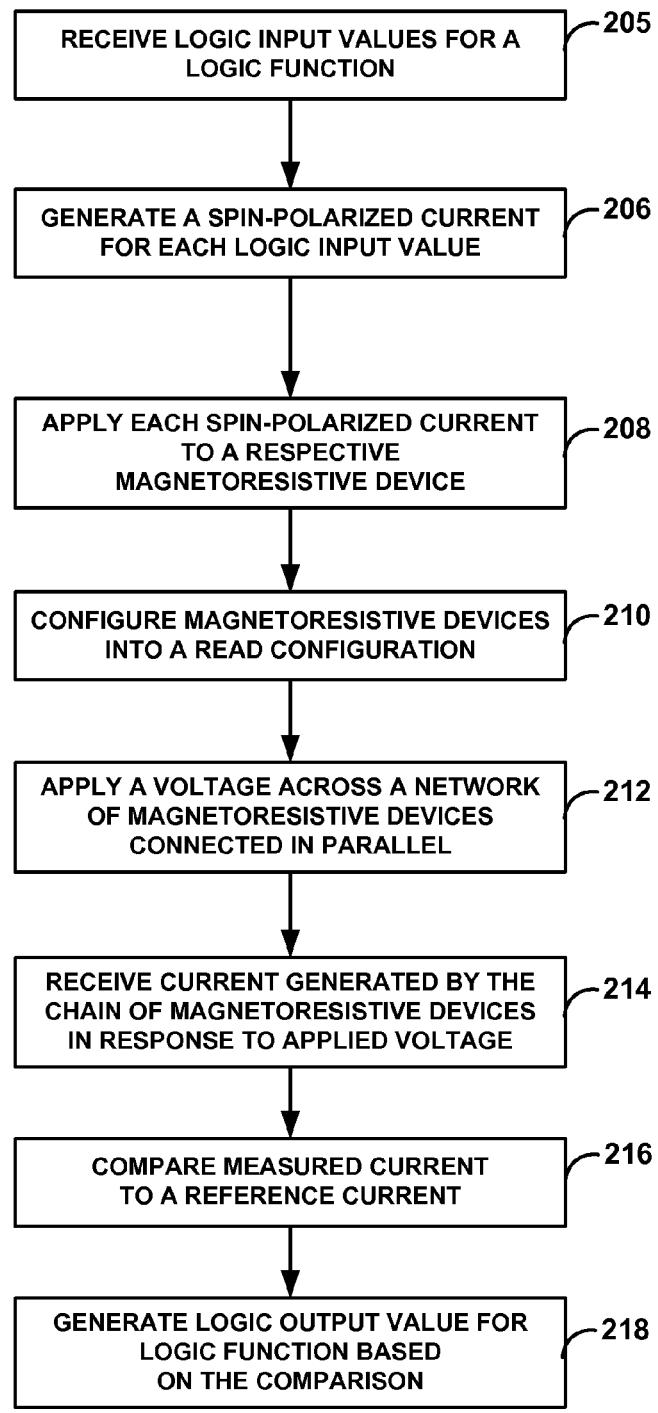
FIG. 15 is a flowchart illustrating an example technique for implementing a logic function with a magnetoresistive device according to this disclosure.

FIG. 15 is a flowchart illustrating an example technique for implementing a logic function with a magnetoresistive device according to this disclosure. In some examples, the technique in FIG. 15 may be used to implement magnetic logic device 10 illustrated in FIG. 1, magnetic logic device 50 illustrated in FIG. 3, and/or magnetic logic device 170 illustrated in FIG. 11.

Spin polarizer cells 66, 68 receive logic input values for a logic function (205), generate a respective spin-polarized current for each logic input value (206), and apply each spin-polarized current to a respective magnetoresistive device (208). Prior to applying the spin-polarized current, control unit 56 may direct switching modules 58, 60, 62 to configure magnetic logic device 50 into a write configuration.

Switching modules 58, 60, 62 may configure MRDs 52, 54 into a read configuration (210). For example, switching modules 58, 60, 62 may configure magnetoresistive devices such that the devices are electrically coupled in parallel to form a network of magnetoresistive devices electrically coupled in parallel.

Bias voltage source 70 applies a voltage across the network of the magnetoresistive devices electrically coupled in parallel (212). For example, bias voltage source 70 may apply a voltage between a first terminal and a second terminal of a network of at least two magnetoresistive devices electrically coupled in parallel. The first terminal and the second terminal may be located on opposite ends of the network of magnetoresistive devices.

Comparator circuit 74 may receive the read current generated by the chain of magnetoresistive devices in response to applied voltage (214). Comparator circuit 74 may compare the read current to a reference current generated by reference circuit 72 (216). Comparator circuit 74 may generate a logic output value for logic function based on the comparison (218). For example, if the amplitude of the read current is greater than the amplitude of the reference current, then comparator circuit 74 may generate a first logic output value (e.g., a logic one). Similarly, if the amplitude of the read current is less than the amplitude of the reference current, then comparator circuit 74 may generate a second logic output value (e.g., a logic zero).

The techniques described herein may be able to produce integrated circuits having lower power consumption and/or increased chip density in comparison to integrated circuits that implement equivalent logic using a CMOS process technology. In contrast to transistor-based CMOS logic gates, the magnetic logic gates designed in accordance with this disclosure may be non-volatile, i.e., such gates may retain their state even if the logic gate is not receiving power. In addition, the techniques in this disclosure may be able to be monolithically integrated with conventional CMOS electronics.

The circuit components described in this disclosure can be implemented as discrete components, as one or more integrated devices, or any combination thereof. The circuit components described herein may be fabricated using any of a wide variety of process technologies including CMOS process technologies. In addition, the circuitry described herein may be used in various applications including telecommunications applications, general computing application, or any application that utilizes a clock generation and distribution system.

Various aspects of the disclosure have been described. These and other aspects are within the scope of the following claims.

The invention claimed is:

1. A method comprising:
receiving, with a magnetic logic device, a function select signal that indicates a combinational logic function that is to be performed by the magnetic logic device on input values stored on the magnetic logic device;
configuring an amount of impedance provided by at least one of a plurality of magnetoresistive devices of a reference circuit of the magnetic logic device based at least on the combinational logic function that is to be performed by the magnetic logic device; and
generating, with the reference circuit, a reference current whose amplitude is based at least on the amount of impedance provided by the at least one of the plurality of magnetoresistive devices of the reference circuit.

2. The method of claim 1, wherein configuring the amount of impedance provided by the at least one of the plurality of magnetoresistive devices comprises outputting a current through the at least one of the plurality of magnetoresistive devices to switch the amount of impedance provided by the at least one of the plurality of magnetoresistive devices.

3. The method of claim 1, further comprising:
receiving a read current from the magnetic logic device;
comparing an amplitude of the read current with the amplitude of the reference current; and
outputting, based on the comparison, a logic value that corresponds to a logic output when the combinational logic function is performed by the magnetic logic device on the input values.

4. The method of claim 3, wherein outputting the logic value comprises outputting a logic one when the amplitude of the read current is greater than the amplitude of the reference current, and outputting a logic zero when the amplitude of the read current is less than the amplitude of the reference current.

5. The method of claim 1, wherein the combinational logic function comprises an AND logic function, and wherein configuring the amount of impedance comprises configuring the amount of impedance provided by the at least one of the plurality of magnetoresistive devices of the reference circuit such that the amplitude of the reference current is greater than an amplitude of an intermediate read current and less than an amplitude of a high read current.

6. The method of claim 1, wherein the combinational logic function comprises an OR logic function, and wherein configuring the amount of impedance comprises configuring the amount of impedance provided by the at least one of the plurality of magnetoresistive devices of the reference circuit such that the amplitude of the reference current is less than an amplitude of an intermediate read current and greater than an amplitude of a high read current.

7. The method of claim 1, wherein the combinational logic function comprises at least one of an AND logic function or an OR logic function.

8. The method of claim 1, wherein the combinational logic function comprises at least one of a NAND logic function, a NOR logic function, and a voting-OR logic function.

9. The method of claim 1, wherein each one of the plurality of magnetoresistive devices comprises at least one of a giant magnetoresistance (GMR) device, a magnetic tunnel junction (MTJ) device, and a tunneling magnetoresistance (TMR) device.

10. An apparatus comprising:
a magnetic logic device operable to receive a function select signal that indicates a combinational logic function that is to be performed by the magnetic logic device on input values stored on the magnetic logic device; and
a reference circuit that includes a plurality of magnetoresistive devices and is operable to generate a reference current whose amplitude is based at least on an amount of impedance provided by at least one of the plurality of magnetoresistive device,
wherein the amount of impedance provided by the at least one of the plurality of magnetoresistive devices of the reference circuit is configured based at least on the combinational logic function that is to be performed by the magnetic logic device.

11. The apparatus of claim 10, wherein the amount of impedance provided by the at least one of the plurality of magnetoresistive devices is configured by outputting a current through the at least one of the plurality of magnetoresistive devices to switch the amount of impedance provided by the at least one of the plurality of magnetoresistive devices.

12. The apparatus of claim 10, wherein the magnetic logic device comprises the reference circuit.

13. The apparatus of claim 10, further comprising a comparator circuit operable to:
receive a read current from the magnetic logic device;
compare an amplitude of the read current with the amplitude of the reference current; and
output, based on the comparison, a logic value that corresponds to a logic output when the combinational logic function is performed by the magnetic logic device on the input values.

14. The apparatus of claim 13, wherein the comparator circuit outputs a logic one when the amplitude of the read current is greater than the amplitude of the reference current, and outputs a logic zero when the amplitude of the read current is less than the amplitude of the reference current.

15. The apparatus of claim 10, wherein the combinational logic function comprises an AND logic function, and wherein the amount of impedance provided by the at least one of the plurality of magnetoresistive devices of the reference circuit causes the amplitude of the reference current to be greater than an amplitude of an intermediate read current and less than an amplitude of a high read current.

16. The apparatus of claim 10, wherein the combinational logic function comprises an OR logic function, and wherein the amount of impedance provided by the at least one of the plurality of magnetoresistive devices of the reference circuit causes the amplitude of the reference current to be less than an amplitude of an intermediate read current and greater than an amplitude of a low read current.

17. The apparatus of claim 10, wherein the combinational logic function comprises at least one of an AND logic function or an OR logic function.

18. The apparatus of claim 10, wherein the combinational logic function comprises at least one of a NAND logic function, a NOR logic function, and a voting-OR logic function.

19. The apparatus of claim 10, wherein each one of the plurality of magnetoresistive devices comprises at least one of a giant magnetoresistance (GMR) device, a magnetic tunnel junction (MTJ) device, and a tunneling magnetoresistance (TMR) device.

20. An apparatus comprising:
means for receiving, with a magnetic logic device, a function select signal that indicates a combinational logic function that is to be performed by the magnetic logic device on input values stored on the magnetic logic device;
means for configuring an amount of impedance provided by at least one of a plurality of magnetoresistive devices of a reference circuit of the magnetic logic device based at least on the combinational logic function that is to be performed by the magnetic logic device; and
means for generating, with the reference circuit, a reference current whose amplitude is based at least on the amount of impedance provided by the at least one of the plurality of magnetoresistive devices of the reference circuit.

* * * * *